United States Patent [19]

Ovshinsky et al.

[11] Patent Number: 4,646,266

[45] Date of Patent: Feb. 24, 1987

[54] PROGRAMMABLE SEMICONDUCTOR STRUCTURES AND METHODS FOR USING THE SAME

[75] Inventors: Stanford R. Ovshinsky, Bloomfield Hills; Robert R. Johnson, Franklin; Vincent D. Cannella, Birmingham; Zvi Yaniv, Southfield, all of Mich.

[73] Assignee: Energy Conversion Devices, Inc., Troy, Mich.

[21] Appl. No.: 655,961

[22] Filed: Sep. 28, 1984

[51] Int. Cl.$^4$ .............................................. G11C 17/00
[52] U.S. Cl. ................................... 365/105; 365/168; 357/45; 340/825.83
[58] Field of Search .................... 365/94, 96, 103, 104, 365/105, 45, 113, 163, 168; 357/45, 59, 86; 340/825.83, 825.84; 307/465

[56] References Cited

U.S. PATENT DOCUMENTS

| | | | |
|---|---|---|---|
| 3,641,516 | 2/1972 | Castrucci et al. | 365/105 X |
| 3,742,592 | 7/1973 | Rizzi et al. | 365/105 X |
| 3,848,238 | 11/1974 | Rizzi et al. | 365/105 |
| 4,174,521 | 11/1979 | Neale | 357/45 |
| 4,420,820 | 12/1983 | Preedy | 365/105 |
| 4,462,088 | 7/1984 | Giuliani et al. | 365/105 |

Primary Examiner—Joseph A. Popek
Attorney, Agent, or Firm—Lawrence G. Norris; Robert S. Nolan; Richard O. Gray, Jr.

[57] ABSTRACT

A solid state semiconductor device is disclosed which is programmable so as to alter the impedance between its two terminals. In many embodiments, the device is programmable to have any one of four conditions: a first in which the electrical impedance is relatively high in both directions; a second in which the impedance is relatively high in one direction and relatively low in the opposite direction; a third in which the impedance is relatively high in the opposite direction and relatively low in the first direction; and a fourth in which the impedance is relatively low in both directions. Such a programmable device can be made with semiconductor layers which form two series coupled back-to-back diodes, each of which can be selectively programmed to lose its rectifying feature. Structures are disclosed which include a plurality of such programmable devices in one or more separately programmable planes, each with its own addressing means. Programmable logic arrays can be formed out of such multilayered cell structures, including programmable logic arrays, in which the AND and OR planes are vertically disposed one on top of the other.

86 Claims, 34 Drawing Figures

FIG. 1A   FIG. 1B   FIG. 1C   FIG. 1D
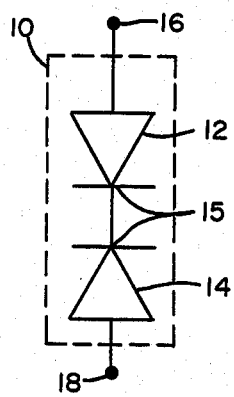 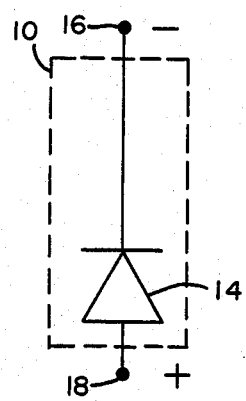 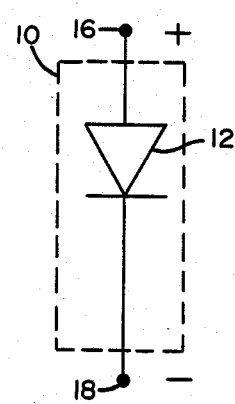 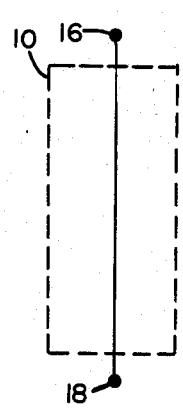
FIG. 2A   FIG. 2B   FIG. 2C   FIG. 2D
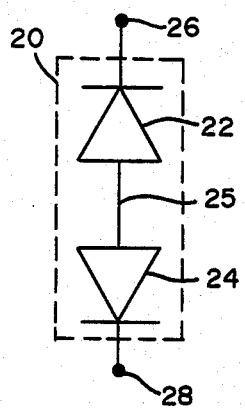 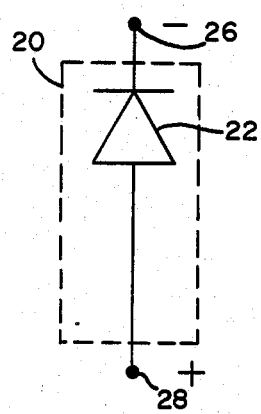 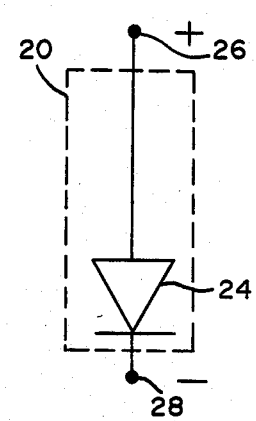 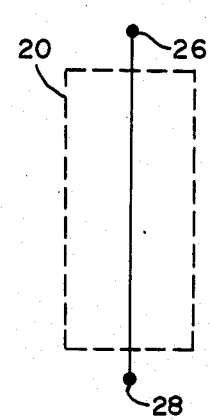
FIG. 3
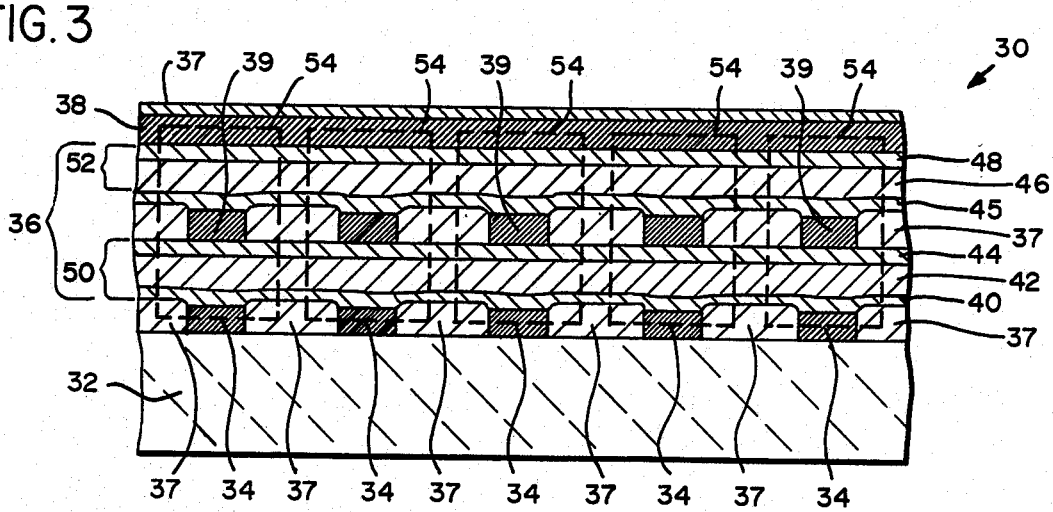

$M_1 = Q_1 \cdot Q_2 \cdot \overline{Q}_3$ $Ji1 = M_1 + M_4 + M_5$ $= Q_1 \cdot Q_2 \cdot \overline{Q}_3 +$ $\overline{Q}_2 \cdot \overline{Q}_3 +$ $Q_1 \cdot \overline{Q}_3$ FIG. 18
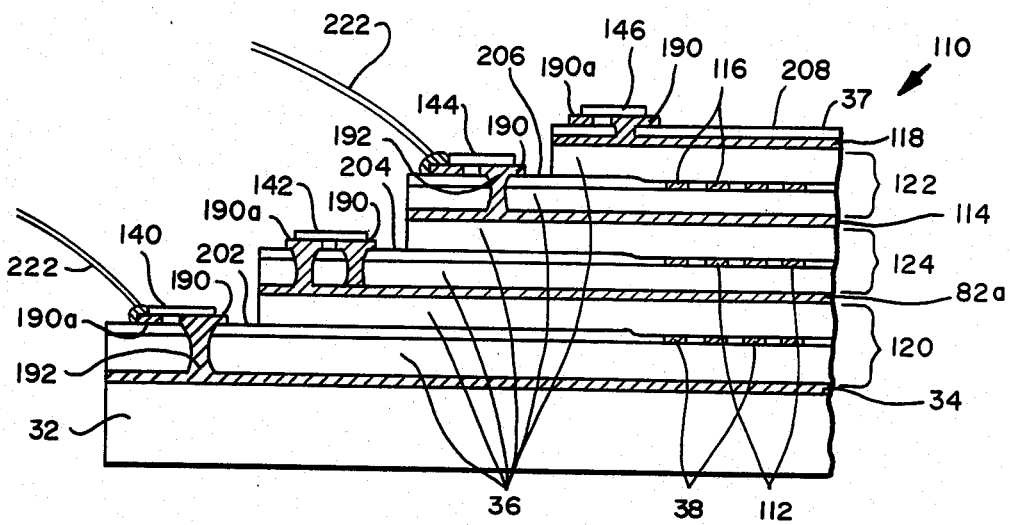
FIG. 19
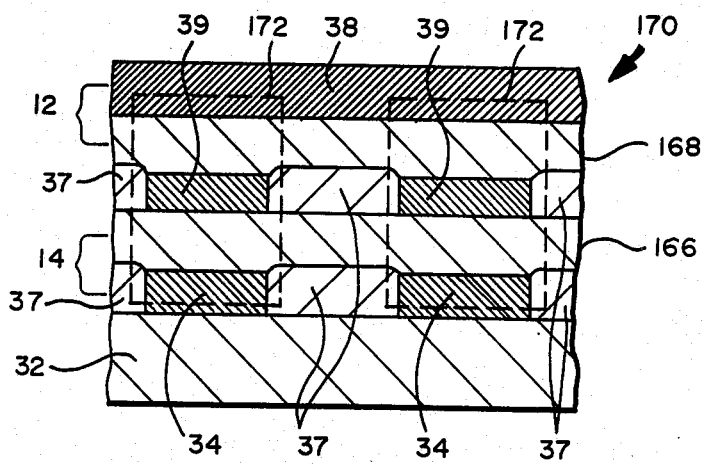
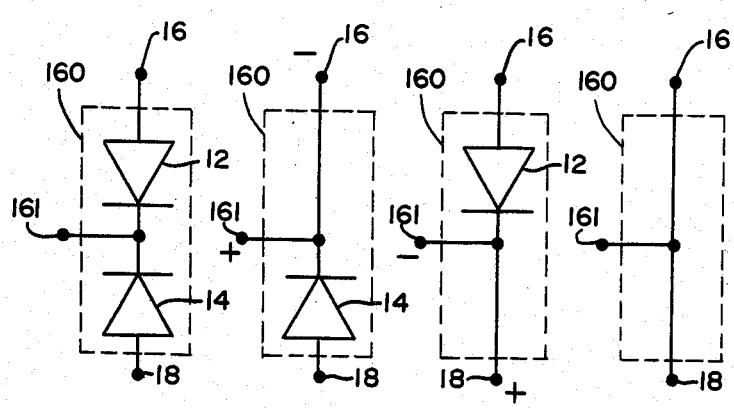
FIG. 20A   20B   20C   20D

PROGRAMMABLE SEMICONDUCTOR STRUCTURES AND METHODS FOR USING THE SAME

FIELD OF THE INVENTION

The present invention relates to a new type of programmable semiconductor device and to programmable circuitry and programming methods using the same.

BACKGROUND OF THE INVENTION

Programmable semiconductor circuits form an important class of electronic components. Such circuits can be created in great number with great economies of scale for a large class of potential uses, and then can be individually customized for a given use by programming. Examples of such programmable circuits include programmable read only memories, commonly called PROMs, and programmable logic circuits, such as gate arrays and programmable logic arrays.

A PROM is a memory device in which memory cells can be selectively programmed to store bits of information. In programmable read only memories, once information has been stored it is retained without the requirement of further electrical power. This is different from standard random access memories (RAMs) which normally lose the information stored in them when power is removed. PROMs have a great variety of uses, from digital signal conversion to programming computers, and are a major type of digital electronic component.

Programmable logic devices come in several kinds. One type, called a gate array, comprises an integrated circuit having a plurality of logic gates with programmable means for selectively interconnecting them to form a desired combination of hard wired logic. Another type of programmable logic device is the programmable logic array, or PLA. A PLA normally consists of two connected intersecting matrices of lines. The first matrix, commonly called the AND plane, has a set of input lines which intersect a set of output lines, called minterms. Each of the minterm lines has a logical value equal to the binary product (or the ANDed value) of the input lines programmed to provide inputs to it. These minterm lines are supplied as inputs to an OR plane, where they intersect the set of lines which form the outputs of the OR plane, called maxterm lines. The logical value of each of the maxterm lines is equal to the binary sum (or the ORed value) of the minterms programmed to provide inputs to it. Since PLAs commonly receive not only logical variables, but also their inverse as inputs, it is possible for the outputs of the PLAs to represent not only AND and OR functions, but also, NOR, NAND and XOR functions. In addition, by latching and clocking the inputs and the outputs of a PLA, and by connecting selected outputs of the PLA to selected ones of its inputs, it is possible to make a state machine capable of cycling through a complex sequence of logical states in response to inputs supplied to the PLA. The PLA can form powerful logical devices which have many uses, from performing simple logic to driving the internal circuitry of computers.

From the above it can be appreciated that programmable devices, such as PROMs and PLAs, have many applications in digital logic design. Therefore, any advances which decrease the size or cost of such devices, or increase their performance are of great use to the electronic arts.

The assignee of the present application has previously developed programmable devices which employ antifuses as programmable circuit elements. Such antifuses have a portion of phase-change material which can be changed, by the application of a programming voltage and current, from a relatively disordered, high resistance state, to a relatively ordered or more crystalline, low resistance state. Such antifuses and programmable arrays using them are described in greater detail in U.S. Pat. No. 4,499,577 issued Feb. 12, 1985 in the names of Scott H. Holmberg and Richard A. Flasck and entitled "An Improved Programmable Cell for Use in Programmable Electronic Arrays", which is hereby incorporated by reference.

The assignee of the present application has also previously disclosed programmable circuits in U.S. Pat. application Ser. Nos. 458,919 and 558,216, filed on Jan. 18, 1983 and Dec. 5, 1983, respectively, both in the name of Robert R. Johnson and both bearing the title "Electronic Matrix Array and Method for Making the Same". These two applications, both of which are incorporated herein by reference, disclose matrix arrays in which a first set of generally parallel lines is separated from a second, crossing set of parallel lines by a selection means structure. These applications disclose a selection means structure formed of a plurality of deposited amorphous semiconductor alloy layers that function together as a diode. This diode causes current to flow between lines on opposite sides thereof so the only current path between them is at their intersection. This enables any given intersections of the lines to be uniquely addressed. The matrix arrays can also include a layer of programmable material, such as an amorphous alloy of a chalcogenide element or an amorphous alloy of silicon overlying the selection means structure. The programmable material can be programmed by, for example, the application of a programming voltage and current between a pair of crossing address lines to convert the programmable material therebetween from a relatively disordered, high resistance state, to a relatively ordered, or more crystalline, low resistance state. Thus by placing a sufficiently high voltage and current between a given line on one side of the programmable layer and a given line on the other, the portion of phase-change material located between those two lines can be converted from a relatively high resistance to a relatively low resistance state, thereby effectively programming the device and enabling the detection of the two resistance states.

The programmable devices disclosed in the four above-mentioned U.S. Pat. references have many advantages. For example, because such devices include vertical programmable cells, they enable a great density of cells to be placed within a given area. Furthermore, because such cells can be fabricated of amorphous semiconductor alloy materials, they can be fabricated at a lower cost and in multiple layers, as is disclosed in the above-mentioned U.S. Pat. application Ser. No. 458,919.

SUMMARY OF THE INVENTION

The present invention relates to a solid state semiconductor device which has at least two terminals and which is capable of being programmed so as to alter the impedance between its two terminals.

In a preferred embodiment the semiconductor device has a plurality of interacting semiconductor functions and is capable of being programmed in four separate conditions: a first in which the electrical impedance between its two terminals is relatively high in both directions; a second in which the impedance between the two terminals is relatively high in a first direction and relatively low in a second, opposite direction; a third in which the electrical impedance between the two terminals is relatively high in the second direction and relatively low in the first direction; and a fourth in which the impedance between the two terminals is relatively low in both directions. In a preferred embodiment, the programmable device is manufactured in the first of the above mentioned conditions and is programmable into a selected one of the remaining three conditions.

In accordance with many embodiments of the present invention, the device includes at least one layer of phase changeable material, such as an amorphous semiconductor alloy including silicon. In certain embodiments, the device includes a plurality of layers of semiconductor materials which form a pair of series coupled back-to-back diodes, separated by metal, which provide the interacting semiconductor functions. In some embodiments, the device has at least two interacting semiconductor functions and further includes a third terminal for separately accessing at least one of the semiconductor functions between the third terminal and a first of the two terminals and at least one other of the semiconductor functions between the third terminal and the other of the two terminals.

In accordance with many preferred embodiments, a plurality of such semiconductor devices are embodied in a cell structure having at least two terminal planes and a plurality of interacting semiconductor functions. The semiconductor cell structure further includes addressing means for programming the cell structure at unique selected locations thereof into any one of its four programmable conditions. The addressing means comprise a first plurality of spaced apart address lines on one of the terminal planes and a second plurality of spaced apart address lines on the other terminal plane which cross the first plurality of lines at an angle to form a plurality of crossover points defining the unique selected locations at which the cell structure is programmable.

According to another embodiment of the invention, a cell structure is provided which comprises a first plurality of vertically arrayed layers of semiconductor material arranged to form at least a first pair of series connected vertically disposed back-to-back diodes. In a preferred embodiment, such semiconductor materials are deposited semiconductor materials such as amorphous semiconductor alloys including, for example, silicon. The cell structure includes means for dividing the series connected vertically disposed back-to-back diodes of the cell structure into a plurality of individual pairs of back-to-back diodes. A separate portion of metal is provided between the back-to-back diodes of each pair. In certain embodiments, the cell structure further includes a second plurality of vertically arrayed layers of semiconductor material formed on the first plurality of such layers to create a second pair of series connected vertically disposed back-to-back diodes. Means are included for dividing the second pair of vertically disposed back-to-back diodes into a plurality of individual pairs of back-to-back diodes.

In some embodiments of the present invention in which two separate vertically arrayed layers, each forming back-to-back diodes are formed one on top of the other, selected ones of the diodes in the first and second pairs of diodes are short circuited to form a folded programmable logic array, which has logic planes placed one on top of the other.

According to another embodiment of the present invention, an integrated circuit is disclosed which comprises a multilayered structure of deposited layers of various materials including semiconductor alloy materials. The layers of semiconductor material are initially deposited as continuous layers and are arranged to provide programmable semiconductor interactions between at least some of the layers so as to perform selected electrical functions at unique selected locations, and to provide such programmable semiconductor interactions in two separate subsets, each separately programmable from the other. The integrated circuit further comprises addressing means for determining the unique selected locations at which the layers perform their selected electrical functions, and for enabling the programming of the semiconductor interactions at such unique selected locations.

In a preferred embodiment of such an integrated circuit, at least one of the layers of semiconductor alloy material is a phase changeable material, such as an amorphous semiconductor alloy of silicon. The layers of semiconductor alloy initially form a pair of series coupled, vertically disposed back-to-back diodes, and the addressing means form means for dividing this pair of back-to-back diodes into a plurality of individual pairs of back-to-back diodes. A separate portion of metal is formed between the back-to-back diodes of such individual pair of diodes. In accordance with such a preferred embodiment, the addressing means comprises a first plurality of spaced apart address lines on one side of said multilayered structure and a second plurality of spaced apart address lines on the other side of said multilayered structure which cross the first plurality of address lines at an angle to form a plurality of crossover points which define the unique selected locations at which the multilayered structure is addressable.

According to another embodiment of the invention, a programmable logic array is disclosed which comprises a multilayered structure of a plurality of vertically arrayed layers of various materials including deposited semiconductor materials. The layers of semiconductor material are initially deposited as continuous layers and at least some of the layers of various material are arranged to provide semiconductor interactions between such layers, so as to provide individually programmable selected logic functions across the structure at selected locations thereof. The programmable logic array further includes means for defining the selected locations at which such individually programmable logic functions are provided and for enabling the programming of such selected logic functions at such locations.

In a preferred embodiment of such a programmable logic array, the logic functions include AND and OR logic functions, and the layers of deposited semiconductor material form at least a pair of series coupled vertically disposed back-to-back diodes. Metal is provided between the back-to-back diodes. In a still further preferred embodiment, the programmable logic array includes at least a pair of such multilayered structures vertically arrayed so as to form a pair of programmable logic planes, such as AND and OR logic planes, superimposed one over the other.

According to another embodiment of the invention, a programmable logic array is disclosed which comprises a multilayered structure of a plurality of vertically arrayed layers of semiconductor material which form a pair of series connected vertically disposed back-to-back diodes. The programmable logic array includes means for dividing this pair of back-to-back diodes into a plurality of individual pairs of back-to-back diodes, and for enabling the short circuiting of selected ones of such diodes so as to program groups of such diode pairs to provide selected logic functions. In a preferred embodiment, the PLA includes at least a pair of such multilayered structures, one superimposed over the other, to form a folded programmable logic array.

According to yet another embodiment of the present invention, a solid state semiconductor programmable switch is provided which comprises at least two cell portions. The cell portions are individually programmable for permitting the conduction of current through the switch in only a first direction, or for permitting conduction of current through said switch in only a second direction opposite the first direction, or for permitting the conduction of current through the switch in both the first and second directions, or, finally, for preventing the conduction of current through the switch in either the first or the second directions. In a preferred embodiment, the programmable switch comprises a pair of series connected vertically disposed back-to-back diodes, and the switch is initially formed with both of the back-to-back diodes functional, so as to prevent conduction of the current through the switch in either the first or the second directions.

According to still another embodiment of the present invention, a method is provided for programming a solid state semiconductor device which has a plurality of semiconductor functions in series between a first and a second terminal, which semiconductor functions include a first subset which provides a relatively high impedance in a first direction and a relatively low impedance in a second, opposite direction, and a second subset which provides a relatively high impedance in the second direction and a relatively low impedance in the first direction. The method comprises selectively programming at least one semiconductor function of the first subset by applying a programming voltage across at least a portion of the device in the first direction.

In certain embodiments, the method further comprises selectively programming at least one semiconductor function of the second subset by applying a programming voltage across at least a portion of the device in the second direction. In some embodiments, the method involves applying the programming voltage between the two above mentioned terminals. However, in alternate embodiments the device includes a third terminal and the at least one semiconductor function of the first subset is between the first and third terminals and the at least one semiconductor function of the second subset is between the second and third terminals and the programming voltage used to selectively program the semiconductor function of the first subset is applied between the first and third terminals.

In a preferred embodiment of this method, the semiconductor functions are provided by rectifying semiconductor junctions and the programming voltage is of sufficient magnitude to cause a breakdown current across at least one of the rectifying junctions. In some such embodiments, the at least one rectifying junction includes phase changeable semiconductor material, and sufficient breakdown current is caused to flow across that junction to cause a phase change in its material.

In another embodiment of the invention an electrical circuit is provided that comprises two conductors and a programmable solid state semiconductor device connected between them. The semiconductor junctions including a first subset which provides a relatively high impedance in a first direction and a relatively low impedance in a second, opposite, direction. The junctions further include a second subset which provides a relatively high impedance in the first direction. The circuit is made so that when originally formed it has a relatively high impedance in both directions between the conductors.

In a preferred embodiment the programmable device includes two back-to-back diodes and the first and second subsets of semiconductor junctions form the rectifying junctions of such back-to-back diodes. The back-to-back diodes include deposited, phase changeable semiconductor material, such as an amorphous semiconductor alloy including silicon and either or both of hydrogen and fluorine.

In one preferred embodiment the back-to-back diodes each include a first layer of deposited semiconductor material of a first conductivity type, a second layer of deposited semiconductor material of a relatively intrinsic type, and a third layer of deposited semiconductor material of a second conductivity type. The programmable device is formed on a substrate and the layers of deposited semiconductor material of the back-to-back diodes are deposited one over the other. A layer of relatively conductive material is placed between the diodes.

In another preferred embodiment the back-to-back diodes each include a deposited semiconductor material and a portion of metal which form a rectifying Schottky junction. The programmable device is formed on a substrate and the back-to-back Schottky diodes are formed one over the other.

These and other aspects and embodiments of the present invention are described in greater detail in the specification which follows.

BRIEF DESCRIPTION OF THE DRAWINGS

In the drawings, which form an integral part of the specification of the present application and which are to be read in conjunction therewith, and in which like reference numerals are employed to designate similar components in various views:

FIG. 1A is an equivalent circuit diagram of a programmable device embodying the present invention, and FIGS. 1B, 1C and 1D are equivalent diagrams showing the device in FIG. 1A after having been programmed in various manners according to the present invention;

FIGS. 2A, 2B, 2C and 2D correspond to FIGS. 1A, 1B, 1C and 1D, with the exception that the relative direction of its rectifying elements have been reversed;

FIG. 3 is a cross-sectional side view of a portion of an integrated circuit embodying the present invention formed so as to create a plurality of individually addressable programmable devices of the type shown schematically in FIG. 1A;

FIG. 18 is a cross-sectional side view of a portion of a large integrated circuit embodying the present invention and having multiple circuit levels, showing smaller integrated circuits down-bonded upon various levels of the larger integrated circuit to drive the circuitry of such levels;

FIG. 19 is a cross-sectional side view of a portion of an integrated circuit according to another embodiment of this invention FIGS. 20A, 20B, 20C and 20D correspond to FIGS. 1A, 1B, 1C and 1D, with the exception that the embodiment of the invention shown in FIGS. 20A through 20D has a third or intermediate terminal;

DETAILED DESCRIPTION OF PREFERRED EMBODIMENTS

Figure 4:
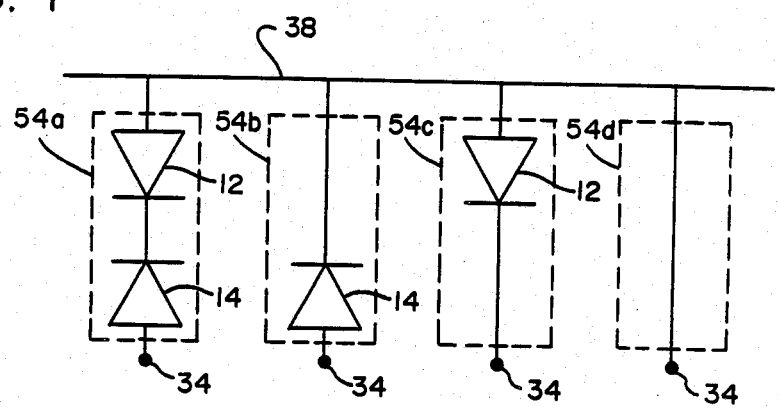
FIG. 4 is a schematic circuit diagram of the circuits shown in cross-section in FIG. 3 after various of its programmable devices have been programmed into various states.

Referring now to FIG. 1A, an equivalent circuit diagram of a programmable circuit device 10 according to the present invention is shown. The programmable circuit device 10 before programming functions as two rectifying elements, or diodes, 12 and 14 series connected with their cathodes 15 tied together. Such a series connection of two diodes with their cathodes connected presents a relatively high impedance to current in either direction between anodes 16 and 18. When a relatively positive voltage is applied to anode 16 of diode 12 and a relatively negative voltage is applied to anode 18 of diode 14, the diode 12 is forward biased and is relatively conductive, but the diode 14 is reverse biased. Under this reverse biased condition, the diode 14 prevents all but a relatively small leakage current from flowing across it, unless the voltage applied exceeds its breakdown voltage. Similarly, when a voltage is applied between the anodes 16 and 18 in the opposite direction, the diode 12 is reverse biased and tend to prevent the passage of any but a relatively small leakage current, unless its breakdown voltage is exceeded.

As is shown in FIGS. 1B, 1C and 1D, the device 10 is selectively programmable to have any one of three conductive states in addition to the relatively non-conductive state described above with regard to FIG. 1A. For example, when a programming voltage is applied between anodes 16 and 18 it reverse biases diode 12. The programming voltage is sufficient to exceed the breakdown voltage of diode 12 and causes a breakdown current sufficient to short circuit the diode. As a result, the relatively high impedance in the reverse biased direction is lost and the diode is caused to have a relatively low impedance in both directions. As a result, the device 10 is programmed to have the electrical properties shown schematically in FIG. 1B. In the programmed state shown in FIG. 1B, the electrical impedance between the anodes 16 and 18 is relatively high to current flowing from anode 16 to anode 18, because diode 14 retains its rectifying properties. But the impedance remains relatively low to current in the opposite direction, because diode 12 has lost its rectifying properties.

Similarly, a programming voltage applied between the anodes 16 and 18 in the opposite direction reverse biases diode 14. When the programming voltage and the resulting programming current are of sufficient magnitude, as explained above, the diode 14 is short circuited, destroying its relatively high impedance in its reverse direction and causing the diode to have a relatively low impedance in both directions. This programs the device 10 to have the electrical characteristics shown schematically in FIG. 1C, in which the electrical impedance is relatively high to current flowing from anode 18 to anode 16, but is relatively low to current in the opposite direction.

When programming voltages and currents of sufficient magnitude, as described above, are applied across anodes 16 and 18 first in one direction and then in the opposite direction, both of the diodes 12 and 14 are short circuited and have their relatively high impedance in their reverse biased direction destroyed, causing them each to have relatively low impedance in both directions. This causes the device 10 to be programmed to have the electrical properties shown in FIG. 1D, in which the impedance in both directions between anodes 16 and 18 is relatively low.

Hence, it can be seen that the present invention provides a programmable device of great flexibility, since it has four separately selectable programmable states: a first state which offers a relatively high impedance in both directions, a second state which offers a relatively high impedance in a first direction and a relatively low impedance in a second direction, a third state which is similar to the second, except that its high and low impedance are offered in the opposite directions, and finally, a fourth state which offers a relatively low impedance in both directions.

In embodiments of the invention in which the diodes 12 and 14 each have a low reverse biased leakage current, the programmable device 10, when in its original state shown in FIG. 1A, operates as a substantially open circuit, causing circuit elements connected by anodes 16 and 18 to remain substantially electrically isolated from each other unless the breakdown voltages of either diode 12 or 14 is exceeded. Such embodiments are useful for selectively isolating circuit elements or switching them into operation in a circuit. In such applications it is also desirable that the diodes 12 and 14, when programmed to conduct in both directions, act as much like a short circuit as possible by creating as low a resistance path as possible. In other applications it is not necessary that the high impedances of the device 10 be so high or that its low impedances be so low. For example, when the programmable device 10 is used in logic or memory circuits where its output is sensed by amplifying or discriminating circuitry, the difference between its high and low impedances need only be great enough to enable the logic circuitry to accurately determine its state.

Each of the programmable device's two back-to-back diodes can be separately and selectively changed to a relatively bi-directional conductive state, by applying a programming voltage and current in the proper direction. A programming voltage which forward biases one of the two diodes reverse biases the other. The forward biased diode offers relatively little impedance, whereas the reverse biased diode offers a much higher impedance, causing a much larger voltage drop across it. As a result, a substantial portion of the programming voltage appears across the reverse-biased diode, enabling that diode to be programmed without programming the other, forward biased diode. In other words, the diodes 12 and 14 each contain at least one semiconductor junction at which the function of electrical rectification takes place. However, because the rectifying functions of the diodes 12 and 14 operate in opposite directions, it is possible, in the manner described above, to breakdown and destroy the rectifying function associated with a selected one of the two diodes without breaking down and destroying the rectifying function associated with the other of the two diodes.

It is believed that the breakdown current which programs the reverse biased diode tends to be concentrated in a relatively narrow path extending in the direction between its anode and cathode. As a result, the concentration of the programming current in the reverse biased diode is relatively high, altering its semiconducting properties and destroying its rectifying properties. This is distinguished from the forward biased diode which offers little impedance to the programming current and which conducts that programming current across a large portion of its area, resulting in a current density in the forward biased diode which is too low to destroy its rectifying properties.

FIGS. 2A, 2B, 2C and 2D are equivalent circuit diagrams corresponding respectively to FIGS. 1A, 1B, 1C and 1D, except that the two back-to-back rectifying elements, or diodes 22 and 24 of the programmable device 20 illustrated therein have their anodes 25 connected, rather than their cathodes, as in FIG. 1A. FIGS. 2B, 2C and 2D show that when programming voltages and currents are applied across the programmable device 20 in the same direction as applied across the device 10 in FIGS. 1B, 1C and 1D, respectively, the circuit element 20 is programmed to have the same relative impedances between its cathodes 26 and 28 as the device 10 has between its anodes 16 and 18.

Referring now to FIG. 3, a cross-sectional side view of a portion of an integrated circuit 30 embodying the invention is shown. As is indicated in FIG. 3 and in FIG. 4, which is an electrical equivalent schematic diagram of the circuit elements shown in FIG. 3, the circuit 30 is a cell structure which includes a plurality of individual programmable cells 54, each originally formed to have the characteristics of the device 10 shown in FIG. 1A. The circuit 30 comprises an insulating substrate 32, which in the embodiment of FIG. 3 is made from glass. In alternate embodiments, the substrate 32 is made of a sheet of stainless steel coated with a thin insulating layer. A layer of conductive metal is deposited upon the substrate 32 and is patterned by photolithographic means into a first set of parallel, equally spaced conductive lines 34. This first set of lines 34 forms the first terminal plane of the cell structure 30. In the preferred embodiment, the metal lines 34 are each approximately 10 microns wide and 1 micron high, and are spaced from each other by approximately 10 microns.

Figure 5:
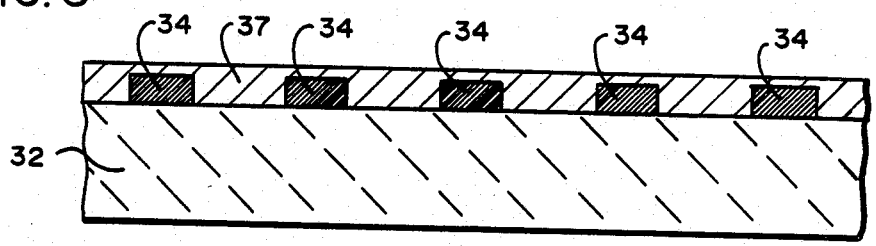
FIGS. 5 and 6 are cross-sectional side views of the circuit shown in FIG. 3 during various stages of its construction.
Figure 6:
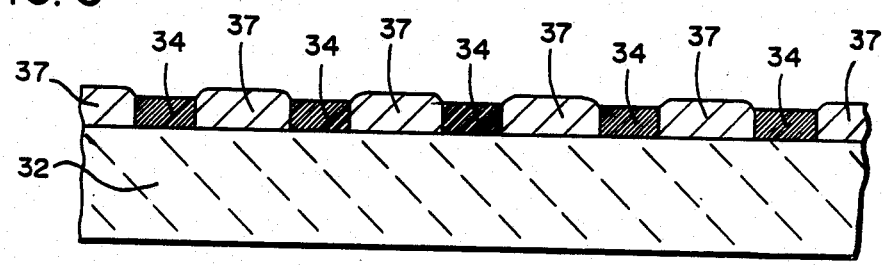

FIGS. 5 and 6 illustrate how the uneven surface created by the metal address lines 34, shown in FIG. 3, is leveled. This makes it easier to properly form subsequent deposited layers. As FIG. 5 shows, after the lines 34 have been deposited and etched, a layer 37 of liquid polyimide is spun across the surface of the substrate 32. The liquid polyimide has a high surface tension which causes its surface to flatten out, even if it is deposited over a surface, such as the surface of the metal lines 34, that is quite irregular. The polyimide is then cured by heat to harden it, and etched until enough of the polyimide is removed to expose the top portions of each of the metal lines 34, as shown in FIG. 6. As a result, a composite surface is created out of the lines 34 and the remaining polyimide 37, which provides a relatively level surface upon which to form subsequent layers.

After the lines 34 are formed, and have the spaces between them filled with the polymide 37 a programmable layer 36 of deposited materials is formed on top of them. Then a second layer of conductive metal is formed on top of the programmable layer 36 and is patterned by photolithographic means into a second set of parallel, equally spaced conductive lines 38. As illustrated, the lines 38 are orthogonal to the lines 34, and parallel to the plane of FIG. 3, so only one of them is seen in that Figure. The lines 38 have the same dimensions as the lines 34, and they form the second terminal plane of the cell structure 30.

Figure 7:
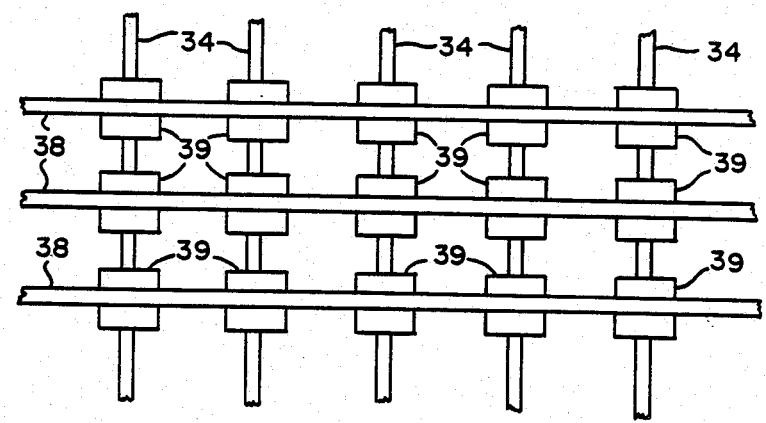
FIG. 7 is a representational top view of the portion of an integrated circuit shown in FIG. 3, illustrating schematically the overlapping of its metal address lines and the individual metal portions which lie between those address lines at their intersections.

In the embodiment shown, the programmable layer 36 is formed of six separate, continuous layers of deposited amorphous silicon alloys separated in the middle by a layer of separated metal portions 39. As is indicated in FIG. 7 a separate metal portion 39 is located at each intersection between the lines 34 and 38. It should be noted that FIG. 7 is highly schematic in that it leaves out all of the layers shown in FIG. 3 except for its three metal layers, and greatly narrows the relative widths of the lines 34 and 38 to make the rectangular portions 39 more visible.

The amorphous silicon alloy first layer 40 of the programmable layer 36 is deposited directly over the lines 34. It is formed of a P+-type amorphous silicon alloy. The second layer 42 is formed of a substantially intrinsic alloy. The intermediate layer 44 is formed of an N+-type alloy. A layer of metal is deposited over the N+-type layer 44. This layer is then etched by photolithographic means to produce the rectangularly shaped metal portions 39 at the what are to become the intersections between the lines 34 and 38. After the metal portions 38 have been formed polyimide 37 is used to fill in between each of those portions in a manner similar to that described above with regard to FIGS. 5 and 6.

Then a fourth amorphous silicon alloy layer 45, which like the layer 44 is N+ type material is deposited. Over this a fifth layer 46, like the second layer 42, is formed of substantially intrinsic alloy. Finally the sixth layer 48, like the first layer 40, is formed of a P+-type alloy. At each junction between these different semiconductor layers a semiconductor interaction or function is created. Together these six semiconductor layers form the equivalent of two back-to-back diode layers, a P-I-N diode layer 50, comprising the layers 40, 42 and 44, and an N-I-P diode layer 52, comprising the layers 44, and the layers 46 and 48. Thus at each intersection between a line 34 and a line 38, a unique separately addressable location is formed which defines a separate device or cell 54 similar to the device 10 shown in FIG. 1A. Thus, the address lines 34 and 38 effectively divide the continuous back-to-back diode layers 50 and 52 into a plurality of pairs of back-to-back diodes contained in the individual programmable cells 54. Due to the relatively high resistance of the materials of layers 40, 42, 44, 45, 46 and 48 and the 10 micron spacing between address lines, the programmable cells 54 are effectively electrically isolated from each other.

It should be clear to those skilled in the art that by reversing the N+-type and P+-type layers, an alternate embodiment of the invention is made in which the bottom diode layer is an N-1-P layer and the top diode layer is a P-I-N layer, and each of the separate devices, or cells 54, so may between a line 34 and a line 38 has the equivalent electrical configuration shown in FIG. 2A.

In FIG. 3, the metal lines 34 and 38 contact a P+-type amorphous silicon alloy in layers 40 and 48, respectively. For this reason the metal of lines 34 and 38 is made of a material, such as molybdenum, which forms a good ohmic contact with such a P+-type material. The metal portions 39 which contact the N+-type amorphous silicon alloy of layers 44 and 45 are made of a material, such as aluminum, which forms a good ohmic contact with such an N+-type material.

Experimental results indicate that when a set of metal lines, such as the lines 38 or a layer of metal portions, such as the metal portions 39, are formed on top of a diode layer, such as the diode layers 50 or 52, it is best to pattern those metal features by use of a photolithographic lift-off technique. The lift-off technique involves exposing and developing a photoresist layer to form holes in the layer corresponding to the shape of the metal features being formed. A thin layer of metal is deposited so as to cover both the remaining photoresist and the holes in the phgotoresist layer. Then in the lift-off stage, the photoresist is etched with acetone, causing the remaining photoresist and the metal on top of it to be removed, leaving in place the metal deposited over the former holes in the photoresist layer.

It is believed that depositing a metal layer across the entire surfaace of a deposited semiconductor diode layer and then etching it is undesirable because it imparts metal into the top of the diode layer across its entire surface, forming a thin conductive layer across the top of the diode which tends to undesirably electrically connect all the individual diodes formed between the intersecting line used in embodiments of the present invention. Patterning metal features by use of a lift-off technique prevents this undesirable electrical connection between diodes, because it prevents metal from touching the top surface of the diode layer between the metal features which are formed on the surface of the diode layer.

Amorphous silicon alloys can be deposited in multiple layers over large area substrates to form structures such as the integrated circuit 30 in high volume, continuous processing systems. Continuous processing systems of this kind are disclosed, for example, in the following U.S. patents: No. 4,400,409 issued Aug. 23, 1983 for "A Method of Making P-Doped Silicon Films and Devices Made Therefrom"; No. 4,542,711 isued Sept. 24, 1985 for "Continuous Systems for Depositing Amorphous Semiconductor Material"; No. 4,410,558 issued Oct. 18, 1983 for "Continuous Amorphous Solar Cell Production System"; No. 4,438,723 issued Mar. 27, 1984 for "Multiple Chamber Deposition and Isolation System and Method"; and No. 4,492,181 issued Jan. 8, 1985 for "Method and Apparatus for Continuously Producing Tandem Amorphous Photovoltaic Cells". As disclosed in these patents, which are incorporated herein by reference, a substrate may be continuously advanced through a succession of deposition chambers, wherein each chamber is dedicated to the deposition of a specific material.

In making the P-I-N layer 50 shown in FIG. 3, a single deposition chamber system can be used for batch processing, or preferably, a multiple chamber system can be used wherein a first chamber is used for depositing a P+-type amorphous silicon alloy, a second chamber is used for depositing an intrinsic amorphous silicon alloy, a third chamber is used for depositing an N+-type amorphous silicon alloy. The N-I-P layer 52 is formed in a similar manner by reversing the order of deposition. Since each deposited alloy, and especially the intrinsic alloy, must be of high purity, the deposition environment in the intrinsic deposition chamber is preferably isolated from undesirable doping constituents within the other chambers to prevent the diffusion of doping constituents into the intrinsic chamber. In the previously mentioned patent applications, wherein the systems are primarily concerned with the production of photovoltaic cells, isolation between the chambers is accomplished by gas gates through which unidirectional gas flow is established and through which an inert gas may be "swept" about the web of substrate material.

In the previously mentioned patent references, deposition of the amorphous silicon alloy materials onto the large area continuous substrate is accomplished by glow discharge decomposition of the process gases. Among these processes, radio frequency energy glow discharge processes have been found suitable for the continuous production of amorphous semiconductors. An improved process for making amorphous semiconductor alloys and devices is disclosed in U.S. Pat. No. 4,517,223 issued May 14, 1985 for "Method of Making Amorphous Semiconductor Alloys and Devices Using Microwave Energy". This process utilizes microwave energy to decompose the reaction gases to cause the deposition of improved amorphous semiconductor materials. This process provides substantially increased deposition rates and reaction gas feed stock utilization. Microwave glow discharge processes can also be utilized in high volume mass production of devices, as disclosed in U.S. Pat. No. 4,515,107 issued May 7, 1985 for "An Improved Apparatus for the Manufacture of Photovoltaic Devices," and to make layered structures, as also disclosed in U.S. Pat. No. 4,521,447 isued June 4, 1985 for "Method and Apparatus for Making Layered Amorphous Semiconductor Alloys Using Microwave Energy".

Each of the programmable cells 54 shown in FIG. 3 has two separately programmable, back-to-back cell portions, or diodes, which correspond to the equivalent diodes 12 and 14 of the programmable device 10 described above with regard to FIGS. 1A through 1D. As a result, the cell 54 is programmable in the manner described with regard to those figures, to have each of the four separately selectable programmable states of the device 10. Each of the cells 54, when formed, has the electrical properties shown in FIG. 1A and in FIG. 4 at 54a. By not applying a programming voltage across a cell 54, it is selectively programmed to stay in this initial state. On the other hand, by applying programming voltage to the lines 34 and 38 associated with a given cell 54, with the positive voltage applied to the line 38, the given cell is selectively programmed to have the conductive characteristics shown at 54b in FIG. 4, in which it conducts current much more readily from line 34 to line 38 than vice versa. Alternatively, by applying the programming voltage in the opposite direction, the cell 54 is programmed to have the characteristics shown at 54c in FIG. 4, in which it conducts current much more readily from line 38 to line 34 than in the opposite direction. Finally, by applying the programming voltage across a cell 54 in both directions it is programmed to have the characteristics shown at 54d in FIG. 4, in which it conducts current relatively well in both directions between lines 34 and 38.

In the embodiment shown in FIG. 3, the P+-type layers 40 and 48 and the N+-type layers 44 and 45 are each approximately 200 angstroms thick. The intrinsic, or I-type, layers 42 and 46 are each approximately 7,000 angstroms thick. The metal portions 39 are provided between the diodes 12 and 14 to help insure that the programming current used to destroy the rectifying characteristics of a reverse biased diode of a given back-to-back pair is distributed by the conductive metal 39 over a large cross-section of the forward biased diode of the pair, so the density of the programming current is too low in the forward biased diode to permanently change its conducting characteristics.

In the embodiment of the invention shown in FIG. 3, a programming voltage of approximately 50 volts is sufficient to program a reverse biased diode of a given programmable cell 54. To prevent undesired changes in the conductive characteristics of the forward biased diode of the cell, the programming current is limited to a value, such as 10 milliamps per square centimeter, which is sufficiently low to avoid overheating or causing phase changes in that diode. Such current limiting is easily achieved by placing a current limiting resistor in the circuit path which provides the programming current.

In the embodiment shown in FIG. 3, the programmable cells 54 are formed from deposited amorphous alloys of silicon containing either or both hydrogen and fluorine, which are phase-change materials. In alternative embodiments of the invention, the phase-changeable semiconductor layers 40, 42, 44, 45, 46 and 48 are formed of deposition alloys of germanium, including alloys of both germanium and silicon. Phase-change materials as disclosed in U.S. Pat. No. 3,530,441 issued on Sept. 22, 1970 in the name of Stanford R. Ovshinsky, which is assigned to the assignee of the present invention and which is incorporated herein by reference, are materials which can be altered between (a) a substantially disordered and generally amorphous structure having local order and/or localized bonding for the atoms, and (b) a more ordered condition. The changes can be substantially within a short range involving a more ordered condition which remains substantially disordered and generally amorphous, or can be from a short range order to a long range order resulting in a crystalline like or pseudo crystalline condition, all of these structural changes involving at least a change in local order and/or localized bonding. Changes in the local order and/or localized bonding which constitute structural change can be of a subtle nature and yet provide drastic changes in the material characteristics, such as electrical characteristics or optical characteristics, which are readily usable in determining or detecting such structural changes.

The scope of the present invention is not limited to programmable circuit elements formed of phase-change materials. However, such phase-change materials have several definite advantages for purposes of the present application. For one thing, phase-change amorphous semiconductor materials are easily deposited upon substrates or other integrated circuit layers, whereas crystalline semiconductor materials must usually be painstakingly grown. A second advantage is that when a sufficient voltage and current is applied across a portion of many phase-change materials, they are changed from a relatively disordered, high resistance state, to a more ordered, more crystalline, low resistance state, as stated above. Thus, when a diode formed of such phase-change material is programmed from its rectifying state to a non-rectifying state by a sufficient programming voltage and current, not only is the rectifying nature of its one or more semiconductor junctions destroyed, but also the state of a portion of its phase-change material is changed from a more disordered to a more ordered state, adding an increased conductivity.

Figure 8:
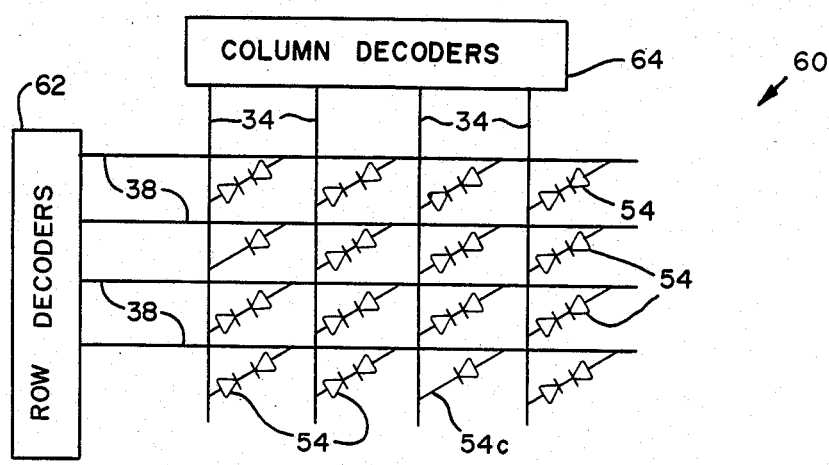
FIG. 8 is a schematic representation of a programmable memory formed using an integrated circuit of the type shown in FIG. 3.

FIG. 8 is a schematic representation of a memory circuit 60 constructed out of the integrated circuit shown in FIG. 3. Circuit 60 includes a plurality of column address lines 34, of the type shown in FIG. 3, and a plurality of row address lines 38, also of the type shown in FIG. 3. At each intersection between a column line 34 and a row line 38, a programmable cell 54, of the type described above, is located. Row decoders 62 and column decoders 64 are used to supply programming voltages between selected row and column lines so as to program the individual cell 54 located at their intersection. The row and column decoders are also used to apply reading voltages to a selected row and column line. By doing so, the amount of current which flows in those selected lines indicates whether or not the programmable cell at their intersections has been previously programmed. The decoders 62 and 64 are formed of crystalline semiconductor materials on separate integrated circuit chips down-bonded to make contact with the lines 34 and 38, in a manner similar to that discussed below with regards to FIGS. 18, 23, 24 and 25.

A significant aspect of the present invention, as it relates to memory devices, is that it enables each of its programmable cells 54 to store any one of the four different states shown in FIGS. 1A, 1B, 1C and 1D. This enables each programmable cell to store the equivalent of two bits of binary information.

Figure 9:
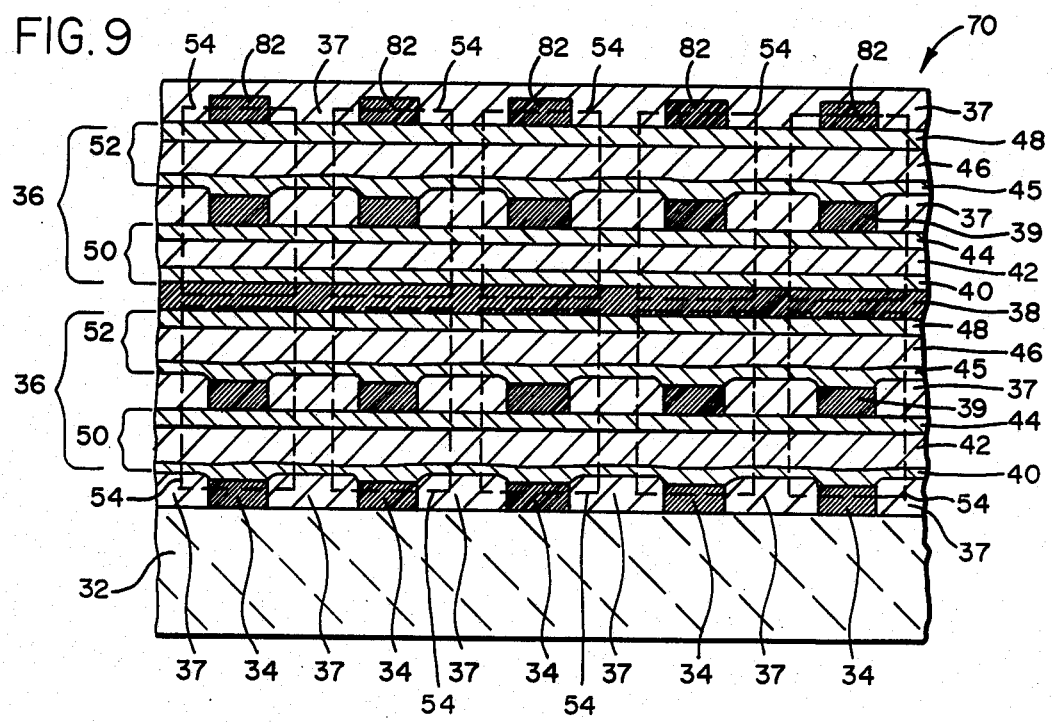
FIG. 9 is a cross-sectional side view of a portion of another integrated circuit embodying the present invention, which is similar to that shown in FIG. 3 except that it has two layers of individually addressable programmable cells, instead of one.

Referring now to FIG. 9, a portion of an integrated circuit 70 formed according to an alternate embodiment of the invention is shown. The integrated circuit 70 forms a cell structure which is virtually identical to that shown in FIG. 3, except the circuit 70 includes an additional programmable layer 36 and an additional set of conductive lines 82 above its conductive lines 38. The top programmable layer 36 and the lines 82 are constructed in the same manner as the bottom programmable layer 36 and the lines 38 described in regard to FIG. 3. The top programmable layer 36, comprises two diode layers 52 and 50, creating a plurality of separately programmable cells 54, each having back-to-back diodes 12 and 14 separated by an individual metal portion 39, between a line 38 and a line 82. Although not shown in the drawings, the surface created by the lines 38 is leveled by means of polyimide, as described with regard to FIGS. 5 and a 6, before the upper programmable layer 36 is deposited on top of it. In addition, the top set of lines 82 is covered with an unetched layer of polyimide 37, similar to that shown in FIG. 5, for purposes of passivation.

Figure 10:
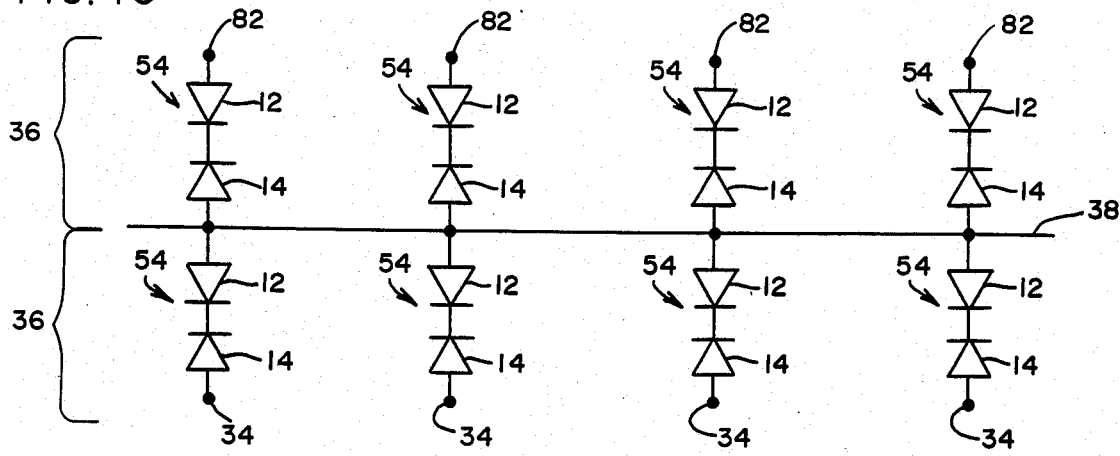
FIG. 10 is a schematic representation of the integrated circuit shown in cross-section in FIG. 9.

As shown in FIG. 10, which is an equivalent schematic diagram of the circuit elements shown in FIG. 9, the integrated circuit 70 comprises three sets of lines, a first set 34, a second set 38 (only one line of which is shown), and a third set 82. Each of these sets is separated by a programmable layer 36 which forms an individual programmable cell 54 at each intersection between adjacent sets of lines. The lines 34 are perpendicular to the lines 38, and are parallel to the lines 82.

Figure 15:
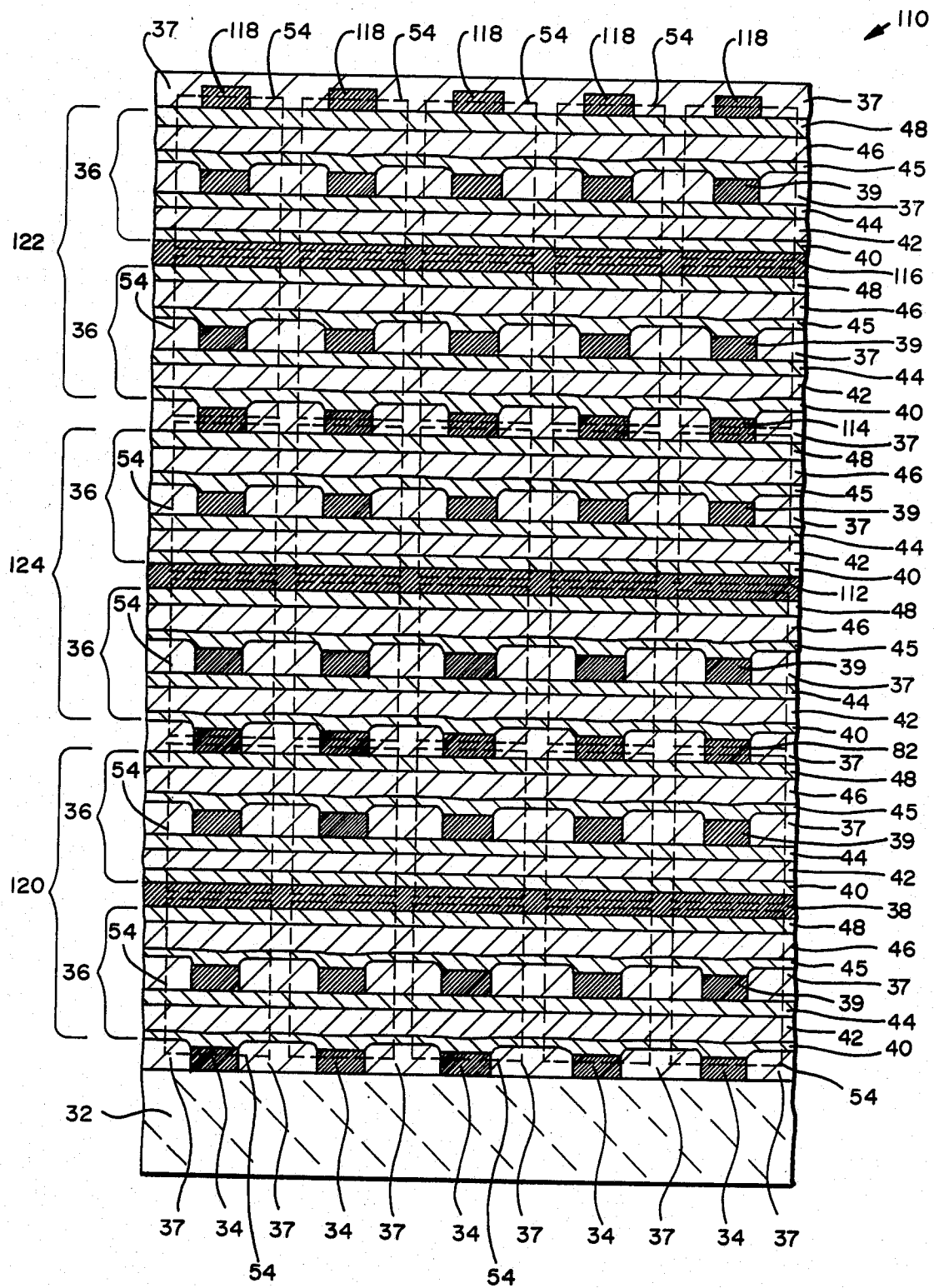
FIG. 15 is a cross-sectional side view of a portion of another integrated circuit embodying the present invention, which is similar to that shown in FIG. 9 except that it has six layers of individually addressable programmable cells, rather than two.

The integrated circuit 70 forms a multilayer memory device, each layer of which is similar to that described above in regard to FIGS. 3, 4 and 8. Bits can be stored in, and read from, the lower layer of programmable cells 54 located between lines 38 and 34 by applying programming or reading voltages between a selected line 38 and a selected line 34, as described above with regard to FIG. 8. Similarly, bits can be stored in, or read from, the upper layer of programmable cells 54 located between the lines 38 and 82 by applying similar voltages between a given line 38 and a given line 82. Thus each of the lines 38 in the circuit 70 is used to address cells in either the lower or upper level of programmable cells, depending upon whether or not a corresponding line 34 or a corresponding line 82 has the appropriate potential applied to it. As is shown in FIG. 15, many more than two layers of programmable cells can be stacked on top of each other, in which case each of the intermediary sets of conductive lines is used to address programmable cells both above it and below it.

Figure 11:
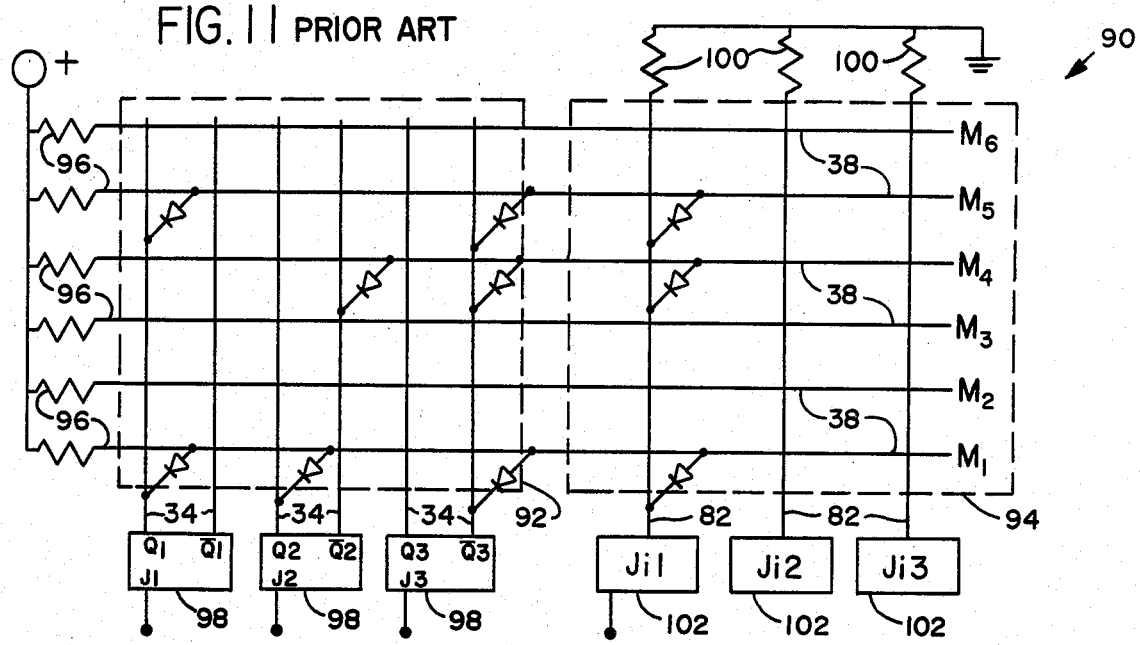
FIG. 11 is a schematic representation of a programmed logic array (PLA) of a general type known in the prior art.

Referring now to FIG. 11, a schematic representation is shown of a programmable logic array, or PLA, 90 of a general type known in the arts of electronic logic design. PLAs of this general type can be constructed according to the present invention by using structures of the type shown in FIG. 9.

The PLA 90 is comprised of two basic parts, an AND plane 92 and an OR plane 94. Using the structure shown in FIG. 8 to make the circuit shown in FIG. 11, the AND plane 92 is formed of the intersection of the first set of conductive lines 34, and the second set of conductive lines 38. Similarly the OR plane 94 is formed of the intersection of the second set of conductive lines 38 and the third set of conductive lines 82. The programmable layer 36 located between the lines 34 and 38 in the AND plane 92 provide means for programmably connecting individual lines 34 to selected lines 38 in the OR plane 94. Similarly, the top programmable layer 36 provides means for programmably connecting individual lines 82 to selected lines 38. The lines 34 provide the input of the PLA and the lines 82 provide its output.

Figure 12:
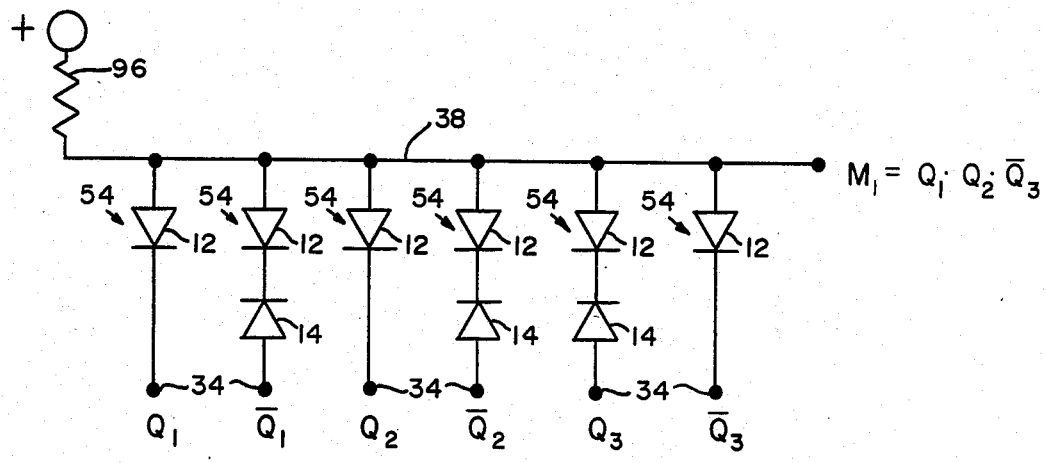
FIGS. 12 and 13 are schematic representations illustrating the logical functions of the PLA shown in FIG. 11 and how such functions can be obtained in accordance with the present invention.

The lines 38, which act as output of the AND plane 92 and inputs to the OR plane 94, are called minterm lines because they are binary products (ANDed functions) which have the minimum binary value of all their inputs. Each of the minterm lines 38 is connected through a pull-up resistor 96 to a positive voltage supply. Each of the terms $J_1$, $J_2$ and $J_3$ are supplied as inputs to J-K flip-flops 98. These flip-flops serve to latch each of the input terms $J_1$, $J_2$ and $J_3$, to amplify it, and to provide both it and its inverse to respective lines 34. The AND plane 92 is programmed by connecting selected ones of the lines 34 to selected minterm lines $M_1$, $M_2$, $M_3$, $M_4$, $M_5$ and $M_6$, through diodes which conduct current from the minterm line to the input lines, but not in the opposite direction. As is shown in FIG. 12, this causes the value of a given minterm line, such as the minterm line $M_1$, to have a value which is equal to the binary product (or ANDed value) of each of the inputs connected to it through such a diode. The input lines $Q_1$, $Q_2$, and $Q_3$ are connected to the minterm line $M_1$, by programming the cell 54 at the intersections between each such input and the minterm line $M_1$ to conduct in the direction indicated by FIG. 12. All the other input lines have the programmable cells at their intersections with the line $M_1$ left in their original condition, which effectively isolates those inputs from the minterm line. If any one of the inputs $Q_1$, $Q_2$ or $Q_3$ programmably connected to the minterm line $M_1$ has a low voltage, that low voltage draws current from the line $M_1$, and pulls that line low because of the resulting voltage drop across the pull-up resistor 96. Thus, the minterm line $M_1$ has a high voltage only when all of the inputs connected to it are high, causing it to act as an AND gate.

The operation of the OR plane 94 is somewhat similar to that of the AND plane 92. The OR plane has output lines 82, each of which has a value equal to the binary sum, or the ORing, of the minterm lines 38 which are connected to it. Each of the output lines 82 is connected through a pull-down resistor 100 to ground. Each of the minterm lines 38 connected to a given output line 82 is connected to that output line through a programmable cell 54 programmed to permit current flow from the minterm line to the output line, but not in the opposite direction. The minterm lines which are not to be connected to a given output line have the programmable cells 54 located between them and that output line left in their original programming state, which effectively disconnects them from that output line. When any of the minterm lines 38 connected to a given output line 82 has a high voltage, that high voltage supplies current to the line 82, causing the current drop across the resistor 100 to increase, pulling the voltage of line 82 up to a high voltage level. The resistor 100 pulls down the voltage of an output line 82 only when all its inputs are low. Thus the value of a line 82 is high whenever any of the inputs connected to it are high, and is low only if all such inputs are low. This causes a given output line 82 to have a binary value equal to the maximum binary value of the minterm lines connected to it. For this reason, the output lines 82 are called maxterm lines.

Figure 13:
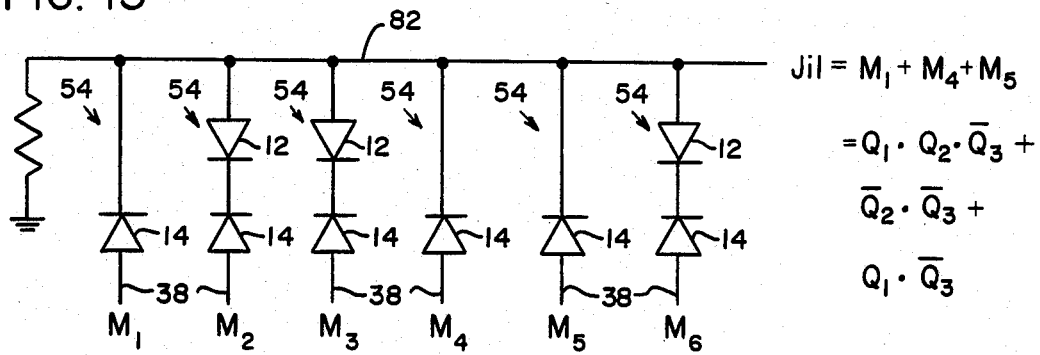

FIGS. 11, 12 and 13 show a PLA which has been programmed so that the minterm line $M_1$ equals the logical product of $Q_1$, $Q_2$ and $Q_3$, written $Q \cdot_1 Q \cdot_2 Q_3$; so that the minterm line $M_4$ equals the logical product of $Q_2$ and $Q_3$, written $Q \cdot_2 Q_3$; and so that the minterm line $M_5$ equals the logical product of $Q_1$ and $Q_3$, written $Q \cdot_1 Q_3$. As a result, the maxterm, or output line, 82 labeled $J_{j1}$ is equal to the logical sum, or the ORing, of the minterm $M_1$, $M_4$ and $M_5$ which sum has the value $Q \cdot_1 Q \cdot_2 Q_3 + Q \cdot_2 Q_3 + Q \cdot_1 Q_3$.

Programmable logic arrays of the type shown in FIG. 11 can be programmed to represent a great range of logical functions. In particular, such PLAs can, through the use of inverted inputs, perform not only AND and OR functions but also NOR, NAND, and XOR, or exclusive OR, functions.

Figure 14:
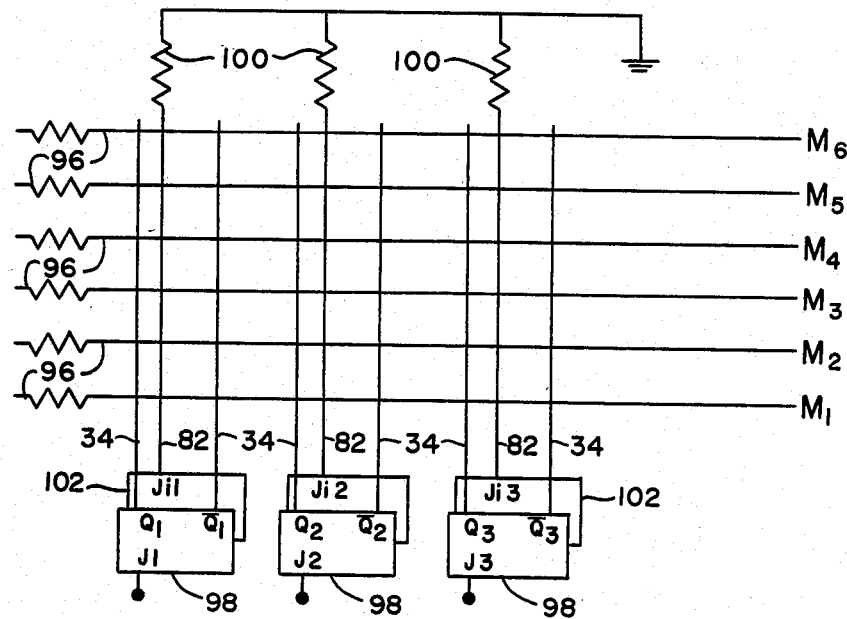
FIG. 14 is a schematic representation of a programmed logic array embodying the present invention in which AND and OR planes are vertically disposed with regard to each other.

Referring now to FIG. 14, an important aspect of the present invention is shown. As can be seen from FIGS. 9 and 10, the present invention enables the input lines 34, the minterm lines 38 and the maxterm, or output, lines 82 of a PLA to be disposed vertically on top of each other so that the AND plane 92 and the OR plane 94 at the intersection of those lines can be placed directly above one another. This form of a PLA, in which the AND and OR planes are placed directly on top of each other, is called a folded PLA by the inventors of the present invention. Such a folded PLA is represented schematically in FIG. 14. An advantage of such folded PLAs is that it enables almost twice the circuit density per unit area.

Figure 16:
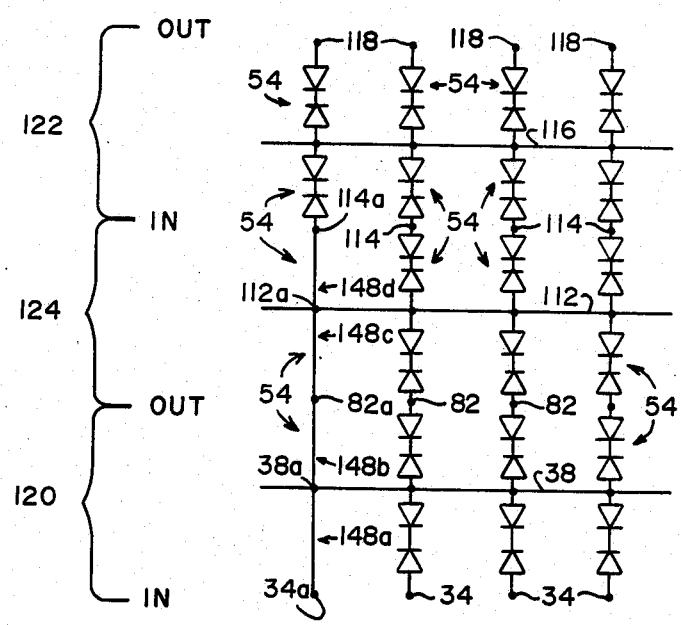
FIG. 16 is a schematic circuit representation of the integrated circuit shown in cross-section in FIG. 15 after certain of its programmable cells have had their state altered.

Referring now to FIG. 15, a portion of an integrated circuit cell structure 110 which embodies the present invention is shown. The circuit 110 is identical to the circuit 70 shown in FIG. 9, except that it has six layers of programmable cells 54 rather than the two of circuit 70. FIG. 16 shows a schematic equivalent of the circuit elements shown in FIG. 15. As FIGS. 15 and 16 show, the circuit 110 has enough layers of programmable cells to form three complete programmable logic array layers 120, 122, and 124. The first, or bottom, PLA layer 120 has a first set of input lines 34, a set of intermediate, or minterm, lines 38 and a set of output lines 82. The second, or top, programmable logic array layer 122 has a first set of input lines 114, a second set of minterm lines 116, and a third set of output lines 118. Intermediate the top and bottom PLA layers 120 and 122 is an interconnection PLA layer 124. The interconnect PLA layer 124 has as its bottom set of lines the output lines 82 of the bottom PLA layer, and as its top set of lines the inputs 114 of the top PLA layer 122 and has an intermediary set of lines 112. Each of the PLA layers 120, 122 and 124 is of substantially identical construction. Each pair of adjacent sets of lines in each of the PLA layers 120, 122 and 124 is separated by a programmable layer 36, which contains two back-to-back diode layers 50 and 52 separated by a plurality of separate metal portions 39. As described above, each of the programmable layers 36 is formed of six layers of amorphous semiconductor alloy materials, including a $P^+$-type layer 40, an I-type layer 42, $N^+$-type layers 44 and 45, a second I-type layer 46, and a second $P^+$-type layer 48. A layer containing the metal portions 39 separated by polyimide 37 is placed between the two $N^+$-type layers 44 and 45. Each of the PLA layers 120, 122 and 124 forms a multilayered structure capable of performing as a programmable memory array or a programmable logic array, in the same manner as the similar multilayered structure shown in FIG. 9.

Figure 17:
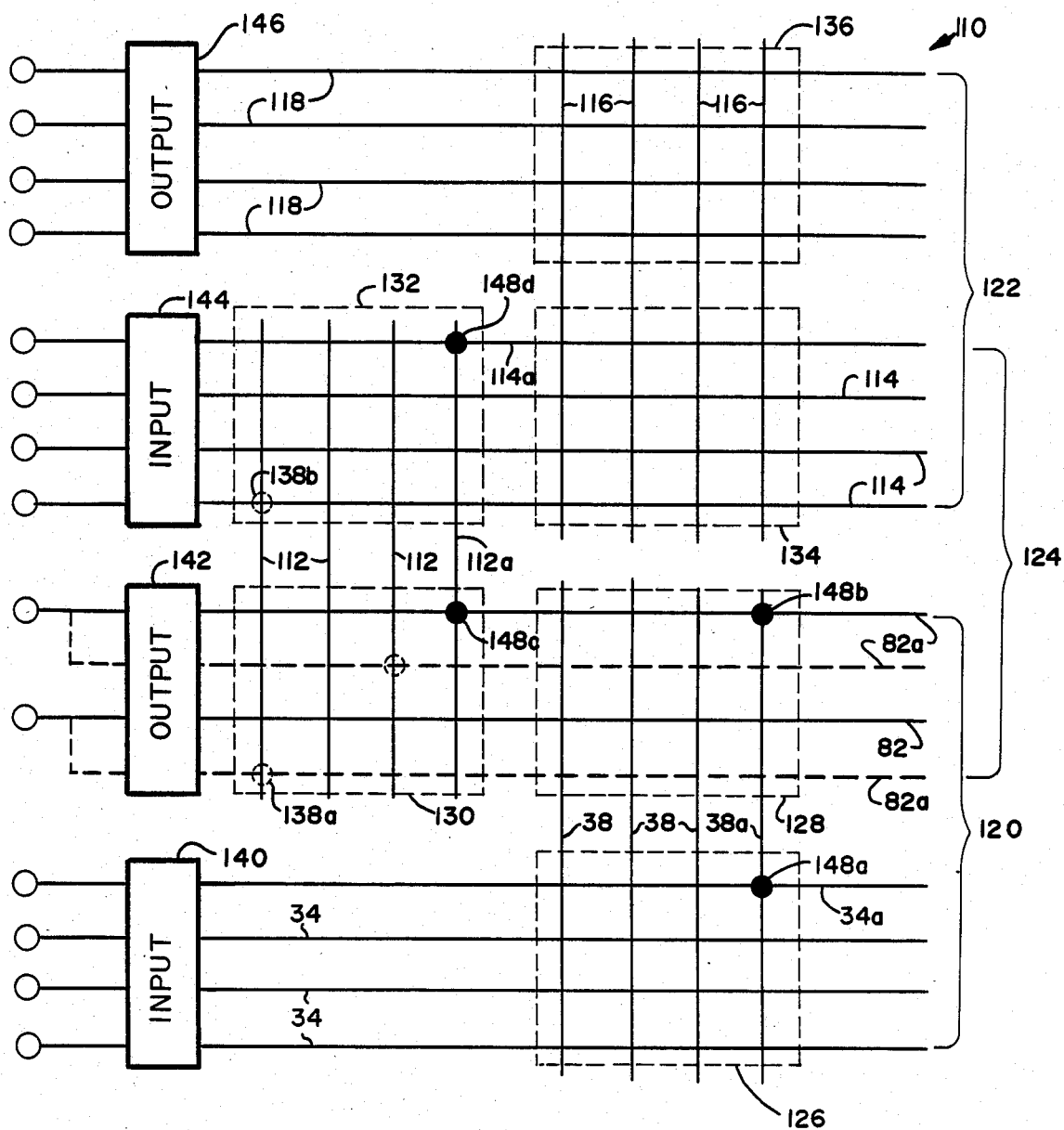
FIG. 17 is a schematic representation illustrating how an integrated circuit of the type shown in FIGS. 15 and 16 is connectable to form a multileveled programmed logic array.

Referring now to FIG. 17, a representation is shown of how the PLA layers 120 and 122 are connected through the interconnection PLA layer 124 to form a combined programmable logic circuit capable of performing functions of great complexity. FIG. 17 is a schematic representation of the multilayered circuit 110 shown in FIG. 15, in which the planes of intersection between successive sets of lines are shown separated from each other for ease of representation. The intersection of the lines 34 and 38 is shown schematically in the area 126, of the lines 38 and 82 in the area 128, of the lines 82 and 112 in the area 130, of the lines 112 and 114 in the area 132, of the lines 114 and 116 in the area 134, and of the lines 116 and 118 in the area 136. It is to be understood, however, that each of these planes of intersection are located directly on top of the other. For example, in FIG. 17 the dotted circle 138a represents an intersection of the bottom-most shown line 82a and a line 112, and the dotted circle 138b represents an intersection of the bottom-most shown line 114 and the same line 112. Although the dots 138a and 138b are shown as displaced from each other in FIG. 17, the intersections they represent are actually directly on top of each other in the circuit 110 and contact the line 112 at the same location.

As shown in FIG. 17, a series of input latches 140 are connected to the input lines 34 of the lower PLA layer 120, and a series of output latches 142 are connected to the output lines 82 of that level. Similarly, a series of input latches 144 are connected to the input lines 114 of the upper PLA level 122, and a series of output latches 146 are connected to the output lines 118 of that layer. In the embodiment of the circuit 110 represented schematically in FIG. 18, the latches 140, 142, 144 and 146 are located on separate integrated circuits, correspondingly numbered 140, 142, 144 and 146. These separate integrated circuits are down-bonded onto contact pads connected to each of the circuit lines with which those latches communicate, as is discussed in greater detail below with regard to FIGS. 23, 24 and 25. The multilayered structure 110 is terraced at its edge so that the input and output lines of each of the PLA layers 120 and 122 can be contacted by a respective down-bonded chip 140, 142, 144 or 146.

The outputs of the output latch 142 are connected to lines 82a, represented with dotted lines in FIG. 17, which pass back under the output latch 142 to form every other one of the lines 82 contained at the top of the PLA layer 120. Although this folding back of outputs from the latch 142 into the plane of the lines 82 cuts in half the number of lines 82 which can be used to represent independent logical sums, this generally does not represent a problem since the device 110 has one circuit line every 20 microns, or 500 lines per centimeter. By programming the output of a line 82a to be connected to an intermediate line 112 in the connecting layer 124, as represented by the dotted circle 138a, and by then connecting that line 112 to an input line 114 of the top PLA 122, as represented by the dotted circle 138b, an output of the lower PLA layer 120 is connected to an input of the upper PLA layer 122. By using this technique any latched output of the lower PLA layer can be connected to any input of the upper PLA layer.

Connections can be made between lines in one PLA layer and those in another without the need to pass through an input or an output latch. For example, the solid black dots 148a, 148b, 148c and 148d in FIG. 17 represent a connection between an input line 34a in the lower PLA layer 120 and an input line 114a in the upper PLA layer 122. This connection does not pass through any input or output latches. It is shown schematically in the left-most column of programmable elements shown in FIG. 16, in which both the diodes 12 and 14 between the lines 34a and 38a, 38a and 82a, 82a and 112a, and 112a and 114a have all been programmed to lose their rectifying characteristics, creating a two way conductive path all the way between lines 34a and 114a. Thus a logic value applied to the line 34a is applied through the connections 148a, 148b, 148c and 148d directly to the line 114a. However, since the lines 38a, 82a, and 112a are directly connected to the line 34a, they cannot be used for independent purposes. But, as stated above, the multilayered circuit 110 has 500 lines per centimeter in each layer, and therefore has many lines to spare for such purposes.

It should be noted that connections between layers, such as the connections 148a, 148b, 148c and 148d, need not be programmed to conduct in both directions and need not all be vertically aligned. When such connections are programmed to conduct in only one direction, they conduct signals between PLA layers only when those signals are of a high, or alternatively of a low, logic value.

Although the structure shown in FIG. 15 has been described as a device containing two separate PLA layers 120 and 122 connected by an interconnecting PLA layer 124, it should be obvious from the foregoing that the circuit 110 is a programmable structure capable of a great many applications and configurations. For example, it is possible to use some of its layers as PLA layers and others as programmable memory layers. Alternatively, it is possible to forego the use of intermediate latches and use each of the programmable layers 36 between each of the sets of lines 34, 38, 82, 112, 114, 116 and 118 as either an AND or an OR logic plane.

Referring now to FIG. 19, a cell structure 170 is shown which has programmable cells 172 formed according to another embodiment of the present invention. In this embodiment the back-to-back diodes 12 and 14 of each cell 172 are Schottky diodes formed by rectifying junctions between layers of deposited semiconductor material and metal. The cell structure 170 has a set of lines 34 formed on an insulating substrate 32 and separated by polyimide 37, as do the other embodiments described above. A layer 166 of relatively intrinsic phase-changeable semiconductor alloy is deposited over the lines 34. Then a layer comprised of a plurality of individual metal portions 39 separated by polyimide is formed in a manner similar to that described above with regard to FIG. 3. On top of the metal portions 39, a second layer 168 of relatively intrinsic phase-changeable semiconductor alloy is deposited. Finally, a top set of lines 38, corresponding to the lines 38 in the embodiments of the invention described above, is formed.

In a cell 172 where the diodes 12 and 14 have these same polarity as the diodes 12 and 14 shown in FIG. 1A, the lines 34 and 38 are formed of platinum to form the anodes of the diodes 14 and 12, respectively, and the phase-changeable semiconductor alloy layers 166 and 168 from the cathodes of those diodes. In such an embodiment, the metal portions 39 are formed of magnesium 167, which forms an ohmic contact with the relatively intrinsic layers 166 and 168. The cells 172 of such embodiments are programmed in the manner described above with regard to FIGS. 1A through 1D.

In alternative embodiments in which the polarity of the back-to-back diodes of the programmable cell 172 is the same as that shown in FIG. 2A, the metal portions 39 are formed of platinum and the metal lines 34 and 38 are made of magnesium. In such embodiments, the cells 172 are programmed in the manner described above with regard to FIGS. 2A through 2D.

In both embodiments, the metal portions 39 perform the function of insuring that the programming current used to cause a phase change in the semiconductor layer of a reversed biased Schottky diode is widely distributed across the semiconductor layer of the forward biased Schottky diode to prevent an undesirable phase change in that forward biased diode. However, in the embodiment of the programmable cell 172 in which the metal portions 39 are formed of platinum, the metal portions also perform the function of creating a rectifying junction with the semiconductor materials of both layers 166 and 168.

The deposited phase-changeable semiconductor alloy used to form layers 166 and 168 of the preferred embodiment are intrinsic amorphous alloys of silicon including either or both hydrogen and fluorine. In alternate embodiments doped silicon alloys are used when it is desired to increase the conductivity of the layers 166 and 168. In yet other embodiments, phase-changeable alloys of germanium, including alloys of both germanium and silicon, are used to form the layer 166 and 168. Magnesium makes a good ohmic contact with intrinsic amorphous silicon alloys. Titanium also makes a good ohmic contact with such alloys. In embodiments in which the lines 34 and 38 are used to make ohmic contact with the layers 166 and 168, it is best not to make those lines out of pure titanium, since that metal's conductivity is lower than desired. Instead, the major thickness of such lines is made out of a good conductor, like aluminum, with a thin layer of titanium placed in contact with the amorphous silicon alloy for the purpose of making ohmic contact.

It should be noted that the characteristics of the Schottky diodes formed in a programmable cell 172 can be varied sharply by changing the metal used to form the Schottky barrier with the deposited semiconductor layer. For example, experiments have shown that the current I across a forward biased Schottky diode varies as a function of voltage V according to the following formula:

$$I = kV^n$$

where k is a constant and n is an exponent. The exponent n varies from 5.7 when the metal of the Schottky diode is an alloy of silver and antimony to 13 when the metal is silver.

It is to be understood that in alternate embodiments of the invention, programmable layers which use Schottky diodes as shown in FIG. 19, are to be substituted for the programmable layers 36 shown in FIGS. 3, 9 and 15, and that such alternate embodiments function, like the structures of FIGS. 3, 9 and 15 to make, among other things, programmable memories and programmable logic arrays.

Referring now to FIGS. 20A, 20B, 20C and 20D, an alternate embodiment 160 of the programmable device of the present invention is represented with equivalent circuit diagrams. The programmable device 160 is identical to the programmable device 10 shown in FIGS. 1A through 1D, with the exception that a conductive terminal 161 is connected to the cathodes 15 which join its two back-to-back rectifying elements, or diodes, 12 and 14. The advantage of such a terminal 161 is that it enables a programming current to be passed through one of the diodes, without being passed through the other. For example, when a programming voltage is applied between the terminal 161 and the anode 16 in the direction indicated in FIG. 20B, the terminal 161 has a positive voltage, the anode 16 has a negative voltage, and the diode 12 is reverse biased. As a result, the programmable cell 160 is programmed so that its top diode 12 has a relatively low impedance in both directions. This causes the device 160 to have the electrical characteristics equivalently illustrated in FIG. 20B, which corresponds substantially to those of the programmed device 10 shown in FIG. 1B, described above. Conversely, when a programming voltage is applied between terminal 161 and anode 18 in a direction so that a relatively negative voltage is applied to terminal 116 and a relatively positive voltage is applied to anode 18, as shown in FIG. 20C, the bottom diode 14 of the device 160 is programmed to have a relatively low impedance in both directions, causing the device 160 to have the electrical characteristics equivalently illustrated in FIG. 18C, which correspond to those of the device 10 shown in FIG. 1C, described above. When the programming voltage is applied first in one of the directions shown in FIGS. 20B and 20C, and then in the other, the device 160 is programmed to have the electrical characteristics equivalently illustrated in FIG. 20D, in which the entire device has a relatively low impedance in both directions between its anodes 16 and 18. This causes the device 160 to have the electrical characteristics of the device 10 shown in FIG. 1D described above.

Figure 21:
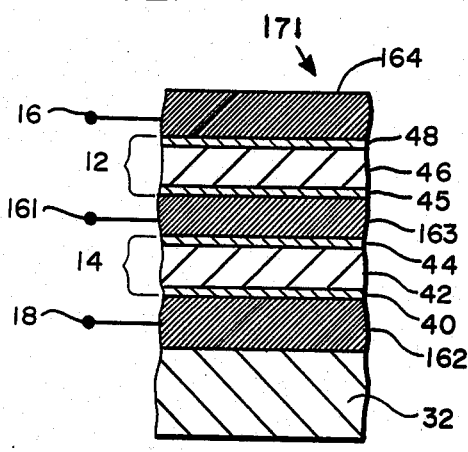
FIGS. 21 and 22 are cross-sectional side views of portions of two different integrated circuits, showing how the programmable device of FIG. 18 is constructed according to two different embodiments of the invention.

FIG. 21 shows a three-channel device 171 of the type described in FIG. 20A constructed by means of integrated circuit fabrication techniques. In the programmable device, or cell, shown in FIG. 21 a layer of molybdenum metal 162 is placed upon an insulating substrate 32. This metal forms the anode contact 18 shown in FIG. 20A. Then the diode 14 is formed over the anode 18 by means of depositing P-I-N layers of amorphous silicon alloy. The diode 14 contains a layer 40 formed of P+-type material, a layer 42 formed of I-type material and a layer 44 formed of N+-type material, all of the type described above with regard to FIGS. 3, 9 and 15. A layer of aluminum metal 163 is deposited upon the top of the diode 14 to form the third terminal 161 of the programmable cell. Then the diode 12 is formed of an N-I-P layer of amorphous silicon alloy deposited on the aluminum 163. The diode 12 comprises a first N+-type layer 45, and I-type layer 46 and a P+-type layer 48, all of the type described above with regard to FIGS. 3, 9 and 15. On top of the P+-type layer 48, a layer of molybdenum metal 164 is deposited to form the anode 16. The bottom and top metal layers 162 and 164 are formed of molybdenum because it makes a good ohmic contact with P+-type amorphous silicon alloys. The intermediate metal layer 163 is formed of aluminum because it forms a good ohmic contact with N+-type amorphous silicon alloys. The semiconductor layers 40, 42, 44, 45, 46 and 48 in the structure of FIG. 21 have the same thickness as in the structures of FIGS. 3, 9 and 15.

Figure 22:
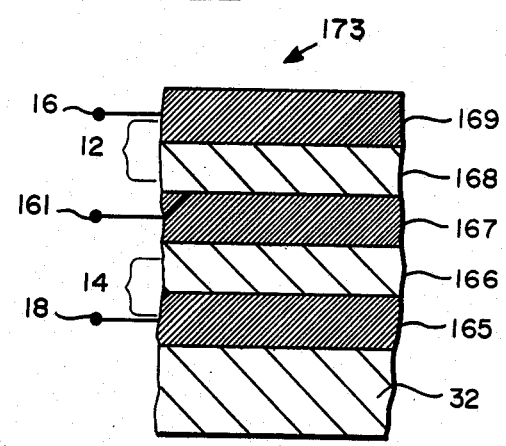

Referring now to FIG. 22, an alternate embodiment 173 of the programmable cell 160 is shown in which the diodes 12 and 14 are Schottky diodes of the general type described with regard to FIG. 19. The cell shown in FIG. 22 is formed by depositing a layer of platinum 165 upon an insulating substrate 32. The platinum in the layer 165 forms the anode 18 shown in FIG. 20A. A layer of intrinsic amorphous silicon alloy 166 is deposited upon the layer 165, and is, in turn, covered with a layer of magnesium 167, which forms the intermediary terminal 161 shown in FIG. 20A. A layer 168, also formed of intrinsic amorphous silicon alloy, is deposited on top of the layer 167, and a layer 169 of platinum is deposited at the top of the cell to form the anode 16. The junctions between the intrinsic semiconductor layers 166 and 168 and the platinum layers 165 and 169 form diodes 12 and 14. These diodes have a relatively high impedance to current flowing from the semiconductor layers to the platinum layers, but a relatively low impedance to current in the opposite direction. Magnesium is used for the intermediary conductive layer 167 because it forms a good ohmic contact with the intrinsic material of layers 166 and 168.

The cells shown in both FIGS. 21 and 22 are programmed in the manner described above with regard to FIGS. 20A through 20D.

Figure 23:
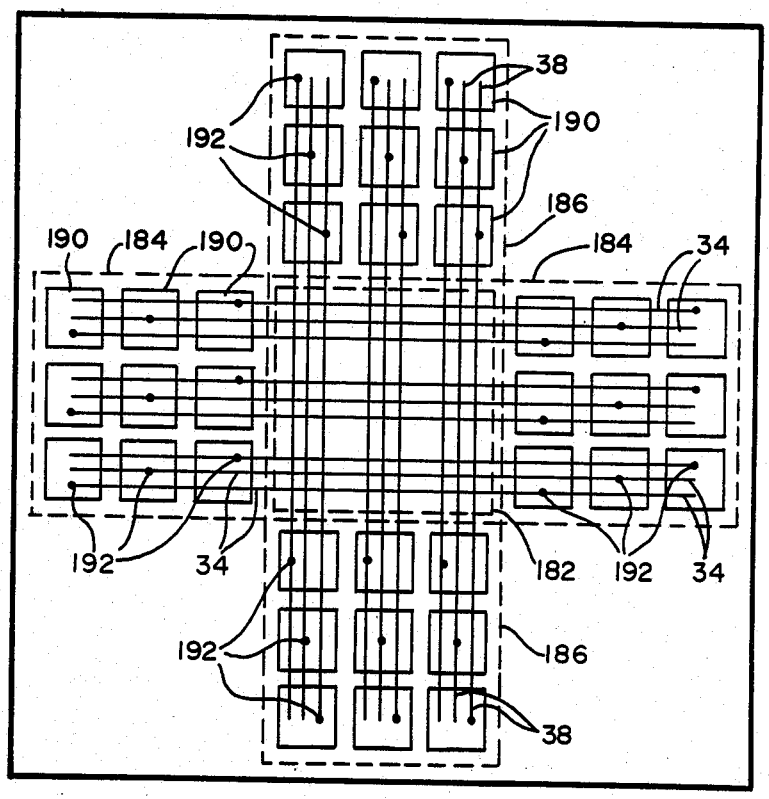
FIG. 23 is a representational top view of an integrated circuit showing how the basic integrated circuit structure shown in FIG. 19 is also used to form an array of programmable cells which do not have of a third terminal connected to the metal layer between their respective diode pairs.
Figure 24:
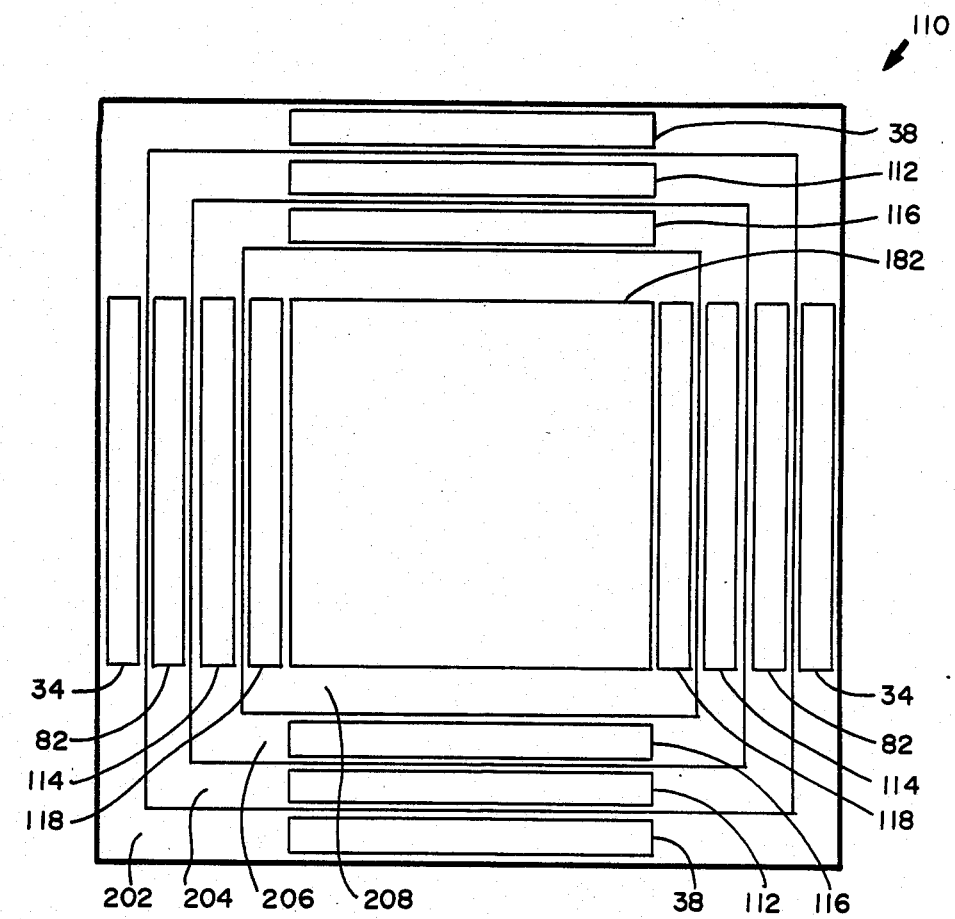
FIG. 24 is a schematic representation showing how relatively large contact pads can be connected to the closely spaced conductive lines of integrated circuits of the type shown in FIGS. 3, 9, 15 and 19 which have multiple levels, or sets, of conductive lines.
Figure 25:
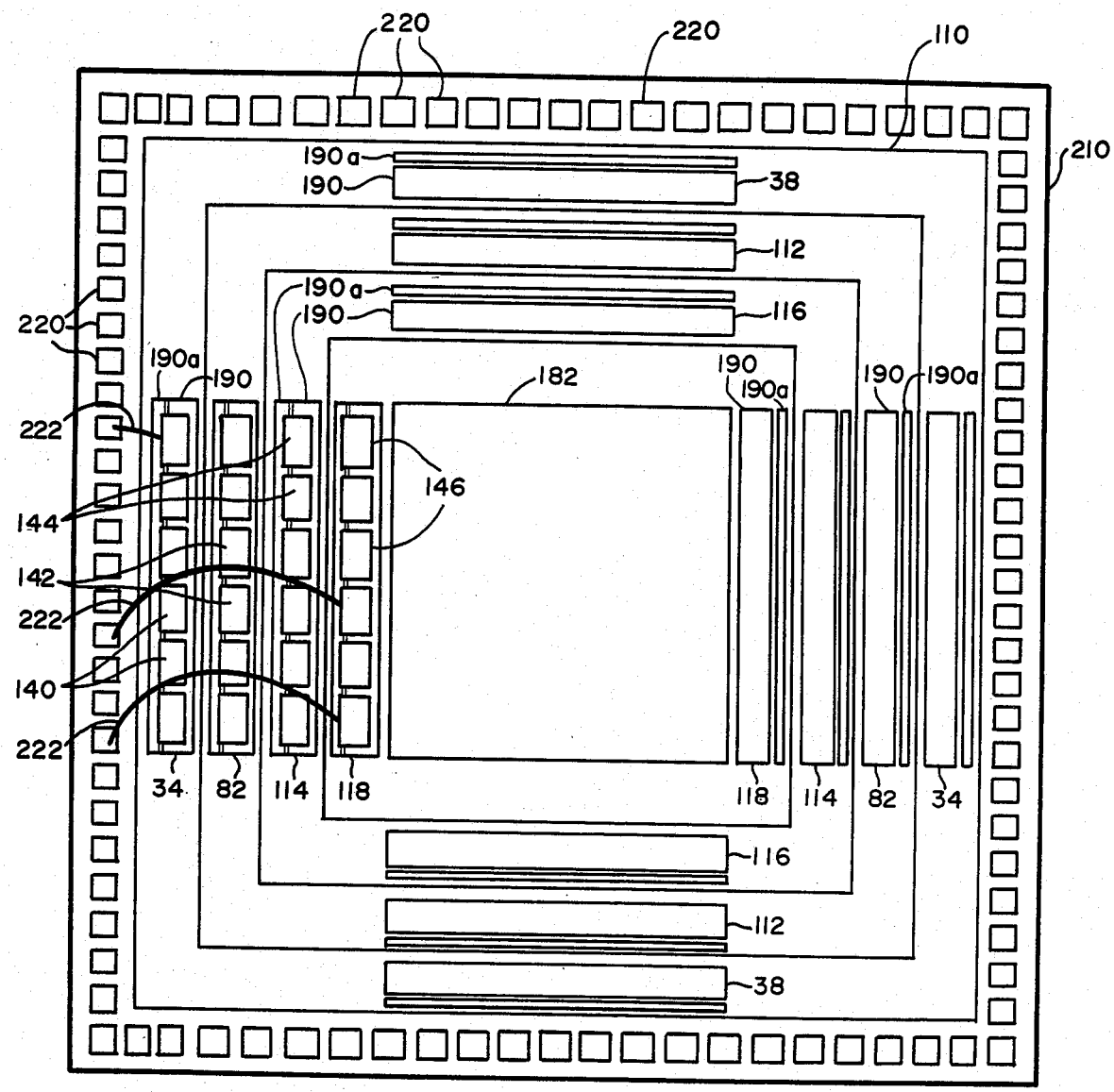
FIG. 25 is a schematic representation similar to that shown in FIG. 24, with the addition of down-bonded integrated circuits, showing, in conjunction with FIG. 18, how driving circuitry can be connected to integrated circuits of the type shown in FIG. 24.

Referring now to FIGS. 23, 24 and 25, a representation is made of how densely packed programmable cells of the type described above can be accessed by circuitry used for programming, addressing, and otherwise communicating with such cells. FIG. 23 is a representational top view of an integrated circuit 180 of the type shown in cross-section in FIG. 3. As stated above, the circuit shown in FIG. 3 has lines 34 and 38 which are 10 microns wide and 10 microns apart. Thus, there are approximately 500 such circuit lines per centimeter. FIG. 23, of course, is not drawn to such a scale. In a preferred embodiment, the portion 182 of the circuit 180 where the lines 34 and 38 overlap is approximately 10 centimeters square, providing approximately 5,000 lines 34 intersecting approximately 5,000 lines 38, or approximately 25 million programmable cells. In order to connect a contact pad of sufficient size so that probes used for testing and programming the circuit, and so that electrical contacts used for connecting its lines to integrated driving circuits, can be connected to each of such closely spaced lines, the structure shown in FIG. 23 is used. According to this structure, each of the lines 38 is extended on each side 186 of the central portion 182, where the lines 38 and 34 intersect. Similarly, each of the lines 34 is extended on each side 184 of the central portion 182. In FIG. 23 these extended portions 186 and 184 are shown as having an area almost equivalent to that of the central portion 182. However, as is shown in FIG. 24, in an actual embodiment, these extended portions of the lines 38 and 34 have a much smaller length than the central portion 182 where the lines intersect.

In the structure shown in FIG. 23, the top lines 38 are coated with a layer 37 of polyimide material similar to that shown in FIG. 5, to protect the metal of those lines from oxidation and to insulate them from the electrical contact pads 190 which are placed over them. Similarly, the portions of the lines 34 which extend into the areas 184 are covered by a programmable layer 36, as well as the polyimide contained in the layer 37 placed on top of the lines 38. Thus it is possible to place a plurality of conductive metal contact pads 190 on top of each of the lines 38 and 32 without causing undesired conduction to any of them. By using photolithographic means, a hole can be etched through the polyimide layer 37 to a desired line 38 below a given contact pad 190, or through the polyimide layer 37 and through the programmable layer 36 to a desired line 34. These connections are indicated by the solid dots 192 shown in FIG. 23. Thus, by placing several rows of contacts 190 over each line 38 or 34, it is possible to have an individual contact pad 190 connected to each conductive line which has a width several times that of the lines.

Referring now to FIGS. 18 and 24, a representation is made of how the contact scheme shown in FIG. 24 is applied to the multilayered circuit 110 shown in FIGS. 15 and 16. As shown in FIG. 18, the circuit 110 is terraced to expose circuit elements at each of four different levels 202, 204, 206 and 208 of the polyimide 37. The top exposed layer 208 is the polyimide which covers the lines 118. The next exposed polyimide layer 206 is the layer which covers the lines 116. The next, layer 204, covers the lines 112. The lowest exposed polyimide layer 202 covers the lines 38.

In the central portion of the integrated circuit 110 where orthogonal circuit lines intersect to define programmable cells, the polyimide layers 206, 204 and 202 are each etched to expose the top portions of the circuit lines over which they are placed, as shown in FIG. 6. However, the exposed peripheral portions of the polyimide layers 206, 204 and 202 are not so etched. In such peripheral portions the lines 116, 112, and 38 are covered by a sufficient thickness of polyimide to insulate them from subsequently deposited contact pads 190, except where etch holes 192 make openings in that polyimide.

In FIGS. 18, 24 and 25, the individual contact pads 190 are too small to be seen separately. In FIGS. 24 and 25 they are shown grouped in areas labeled with the number of the lines to which they connect. Thus on the bottom exposed layer 202, the rectangles labeled 34 define the areas in which contact pads 190 are formed and individually connected to the lines 34 through the polyimide of layer 202 and the programmable layer 36 which is immediately below that polyimide. On the same layer, the plurality of contact pads 190 which are individually connected to the lines 38 are labeled in the rectangular areas bearing the numerals 38. In these areas, connection is made by the contact pads 190 to individual lines 38 through a contact hole in the polyimide of layer 204. Similarly, on the exposed layer 204, contact pads 190 are connected to individual lines 82 and 112; on the exposed layer 206 they are connected to the lines 114 and 116; and finally, on the top exposed layer 208 they are connected to lines 118.

Thus the terrace structure shown in FIGS. 18, 24 and 25 enables each line 34, 38, 82, 112, 114, 116 and 118 to have an individual contact pad placed near both of its opposite ends. This makes it possible for integrated circuits to be down-bonded onto such contact pads so as to send signals to and receive signals from each individual circuit line. It also enables such circuit lines to be tested and programmed, either by such down-bonded integrated circuits or by electrical probes.

Referring now to FIGS. 18 and 25, it is shown how integrated circuit, such as the integrated circuits 140, 142, 144 and 146, are down-bonded onto the contact pads 190 located in the regions labeled 34, 82, 114 and 118, when the integrated circuit 110 is used as a device having multiple PLA layers. The entire circuit 110 is bonded onto a mounting substrate 210, which includes a plurality of contact pads 220 around its periphery. The array of contact pads 190 contained within each of the areas 34, 38, 82, 112, 114, 116 and 118 includes a row of contact pads 190a, positioned to be located on the opposite side of down-bonded chips from the other contact pads 190 connected to the circuit lines 34, 38, 82, 112, 114, 116 and 118. Because of their small size, the individual pads 190a are not shown in FIG. 25, but rather are represented as a strip-shaped portion of their respective contact pad area. Pieces of bonding wire 222, only a few of which are shown in FIG. 25 for purposes of simplification, are then used to connect selected ones of these pads 190a to selected contact pads 220 located on the perimeter of the mounting substrate 210. Although all the down-bonded integrated circuits shown in FIG. 25 are located on the left-hand side of the circuit 110, it is possible to mount such chips in the contact pad arrays 34, 82, 114 and 118 shown on the right-hand side of that Figure. Distributing the down-bonded integrated circuits more evenly around the edge of the circuit 110 makes the wiring of the connections from such chips to the contact pads 220 less crowded and more easy to accomplish.

When the integrated circuit 110 is used as a programmable memory, down-bonded chips must also be mounted on the contact pad arrays 38, 112 and 116, so that the programmable layers of the circuit 160 can be addressed from both sides.

From the foregoing it is apparent that the programmable devices of the present invention can be employed in a variety of applications, including not only programmable read-only memories and PLAs, as described above, but any other application in which it is desired to programmably store bits of information, selectively connect desired circuit elements, or selectively connect circuit elements to each other through a device which can be programmed to not conduct at all, to conduct in a first direction but not in a second, to conduct in the second direction but not the first, or to conduct in both the first and second directions. It is recognized, of course, that those skilled in the art may make various modifications or additions to the preferred embodiment chosen to illustrate the invention without departing from the spirit and scope of the present contribution to the art.

What is claimed is:

1. A solid state semiconductor device having at least two terminals and a plurality of layers of semiconductor material to provide a plurality of interacting semiconductor functions, said device being programmable in a first condition in which the electrical impedance between said two terminals is relatively high in both directions, a second condition in which the electrical impedance between said two terminals is relatively high in one direction and relatively low in the opposite direction, a third condition in which the electrical impedance between said two terminals is relatively high in said opposite direction and relatively low in said one direction, and a fourth condition in which the electrical impedance between said two terminals is relatively low in both said directions.

2. A device as defined in claim 1, wherein said device is manufactured in one of said conditions and programmable into any one of said remaining three conditions.

3. A device as defined in claim 2, wherein said device is manufactured in said first condition.

4. A device as defined in claim 1, wherein said device includes at least one layer of phase-changeable material.

5. A device as defined in claim 4, wherein said phase-changeable material comprises an amorphous semiconductor alloy.

6. A device as defined in claim 5, wherein said amorphous semiconductor alloy includes silicon.

7. A device as defined in claim 5, wherein said amorphous semiconductor alloy includes germanium.

8. A device as defined in claim 5, wherein said amorphous semiconductor alloy includes both silicon and germanium.

9. A device as defined in claim 1 wherein said plurality of layers of semiconductor material form a pair of series coupled back-to-back diodes for providing said interacting semiconductor functions.

10. A device as defined in claim 9 including metal between said back-to-back diodes.

11. A device as defined in claim 1, wherein said device has at least two interacting semiconductor functions and wherein said device further includes a third terminal for separately accessing at least one of said semiconductor functions between said third terminal and a first of said two terminals and at least one other of said semiconductor functions between said third terminal and the other of said two terminals.

12. A solid state semiconductor cell structure having at least two terminal planes and a plurality of layers of semiconductor material to provide a plurality of interacting semiconductor functions, said cell structure being programmable in a first condition in which the electrical impedance between said two planes is relatively high in both directions, a second condition in which the electrical impedance between said two planes is relatively high in one direction and relatively low in the opposite direction, a third condition in which the electrical impedance between said two planes is relatively high in said opposite direction and relatively low in said one direction, and a fourth condition in which the electrical impedance between said two planes is relatively low in both said directions, and
addressing means for programming said cell structure at unique selected locations thereof into any one of said conditions.

13. A cell structure as defined in claim 12, wherein said addressing means comprises a first plurality of spaced apart address lines on one of said terminal planes and a second plurality of spaced apart address lines on said other terminal plane crossing said first plurality of address lines at an angle to form a plurality of crossover points defining said unique selected locations.

14. A cell structure as defined in claim 12, wherein said cell structure is manufactured in one of said conditions and programmable at said unique selected locations into any one of said remaining three conditions.

15. A cell structure as defined in claim 14, wherein said cell structure is manufactured in said first condition.

16. A cell structure as defined in claim 12, wherein said cell structure includes at least one layer of phase changeable material.

17. A cell structure as defined in claim 16, wherein said phase changeable material comprises an amorphous semiconductor alloy.

18. A cell structure as defined in claim 17, wherein said amorphous semiconductor alloy includes silicon.

19. A cell structure as defined in claim 17, wherein said amorphous semiconductor alloy includes germanium.

20. A cell structure as defined in claim 17, wherein said amorphous semiconductor alloy includes silicon and germanium.

21. A cell structure as defined in claim 12 wherein said plurality of layers of semiconductor material form a pair of series coupled back-to-back diodes for providing said interacting semiconductor functions.

22. A cell structure as defined in claim 21 including metal between said back-to-back diodes.

23. A cell structure as defined in claim 12, wherein said cell structure has at least two interacting semiconductor functions and wherein said cell structure further includes a third terminal plane for separately accessing at least one of said semiconductor functions between said third terminal plane and a first of said two terminal planes and at least one other of said semiconductor functions between said third terminal plane and the other of said two terminal planes.

24. A programmable cell structure comprising a first plurality of vertically arrayed layers of semiconductor materials arranged to form at least a first pair of series connected vertically disposed back-to-back diodes.

25. A cell structure as defined in claim 24 including metal between said back-to-back diodes.

26. A cell structure as defined in claim 24, wherein said semiconductor materials are deposited semiconductor materials.

27. A cell structure as defined in claim 26, wherein said deposited semiconductor materials are amorphous semiconductor alloy materials.

28. A cell structure as defined in claim 27, wherein said amorphous semiconductor alloy materials include silicon.

29. A cell structure as defined in claim 27, wherein said amorphous semiconductor alloy materials include germanium.

30. A cell structure as defined in claim 27, wherein said amorphous semiconductor alloy materials include both silicon and germanium.

31. A cell structure as defined in claim 24 further including means for dividing said first pair of series connected vertically disposed back-to-back diodes into plural pairs of series connected vertically disposed back-to-back diodes.

32. A cell structure as defined in claim 31 including a separate portion of metal between the back-to-back diodes of each of said plural pairs of said back-to-back diodes.

33. A cell structure as defined in claim 24 further including a second plurality of vertically arrayed layers of semiconductor materials formed on said first plurality of vertically arrayed layers of semiconductor materials to form a second pair of series connected vertically disposed back-to-back diodes over said first pair of series connected vertically disposed back-to-back diodes.

34. A cell structure as defined in claim 33 further including means for dividing each said first and second pairs of series connected vertically disposed back-to-back diodes into first and second respective plural pairs of series connected vertically disposed back-to-back diodes.

35. A cell structure as defined in claim 34, wherein selected ones of said diodes of said first and second plural pairs of diodes are short circuited for forming a folded programmable logic array.

36. An integrated circuit comprising:
a multilayered structure of deposited layers of various materials including semiconductor alloy materials, said layers of semiconductor alloy materials being initially deposited as continuous layers, said layers being arranged to provide programmable semiconductor interactions between at least some of said layers so as to perform selected electrical functions at unique selected locations, and to provide said programmable semiconductor interactions in two separate subsets, each separately programmable from the other; and
addressing means for defining said unique selected locations and for enabling the programming of said semiconductor interactions of said semiconductor alloy material layers at said unique selected locations.

37. An integrated circuit as defined in claim 36, wherein said deposited semiconductor materials are amorphous semiconductor alloy materials.

38. An integrated circuit as defined in claim 37, wherein said amorphous semiconductor alloy materials include silicon.

39. An integrated circuit as defined in claim 37, wherein said amorphous semiconductor alloy materials include germanium.

40. An integrated circuit as defined in claim 37, wherein said amorphous semiconductor alloy materials include both silicon and germanium.

41. An integrated circuit as defined in claim 36, wherein at least one of said layers of semiconductor alloy material is a phase changeable material.

42. An integrated circuit as defined in claim 36, wherein said layers of semiconductor alloy materials initially form a pair of series coupled vertically disposed back-to-back diodes.

43. An integrated circuit as defined in claim 42 including metal between said back-to-back diodes.

44. An integrated circuit as defined in claim 42, wherein said addressing means forms means for dividing said pair of series connected vertically disposed back-to-back diodes into plural pairs of series connected vertically disposed back-to-back diodes.

45. An integrated circuit as defined in claim 44 including a separate portion of metal between the back-to-back diodes of each of said plural pairs of said back-to-back diodes.

46. An integrated circuit as defined in claim 36, wherein said addressing means comprises a first plurality of spaced apart address lines on one side of said multilayered structure and a second plurality of spaced apart address lines on the other side of said multilayered structure crossing said first plurality of address lines at an angle to form a plurality of crossover points defining said unique selected locations.

47. A programmable logic array comprising a multilayered structure of a plurality of vertically arrayed layers of various materials including deposited semiconductor alloy materials, said layers of semiconductor materials being initially deposited as continuous layers and at least some of said layers of various materials being arranged to provide semiconductor interactions between said layers for providing individually programmable selected logic functions across said structure at selected locations thereof; and
means defining said selected locations and for enabling the programming of said selected logic functions at said selected locations.

48. A logic array as defined in claim 47, wherein said logic functions include AND and OR logic functions.

49. A logic array as defined in claim 47, wherein said layers of deposited semiconductor material form a pair of series coupled vertically disposed back-to-back diodes.

50. A logic array as defined in claim 49 including metal between said back-to-back diodes.

51. A logic array as defined in claim 47 including a pair of said multilayered structures, said structures being vertically arrayed to form a pair of programmable logic planes superposed one over the other.

52. A logic array as defined in claim 51, wherein said structures are programmed to provide an AND logic plane and an OR logic plane superposed one over the other.

53. A programmable logic array comprising a multilayered structure of a plurality of vertically arrayed layers of semiconductor materials to form a pair of series connected vertically disposed back-to-back diodes; and means for dividing said pair of series connected vertically disposed back-to-back diodes into plural pairs of series connected vertically disposed back-to-back diodes and for enabling the short circuiting of selected ones of said diodes for programming groups of said diode pairs to provide selected logic functions.

54. A logic array as defined in claim 53 including a separate portion of metal between the back-to-back diodes of each of said plural pairs of said back-to-back diodes.

55. A logic array as defined in claim 53 including a pair of said multilayered structures, one superposed over the other, to form a folded programmable logic array.

56. A logic array as defined in claim 55, wherein the diode pairs of one of said structures are programmed to form an AND logic plane and the diode pairs of the other said structure are programmed to form an OR logic plane.

57. A solid state semiconductor programmable switch comprising a plurality of layers of semiconductor material to form at least two series connected vertically disposed cell portions; said cell portions being individually programmable for permitting the conduction of current through said switch in only a first direction, or for permitting the conduction of current through said switch in only a second direction opposite said first direction, or for permitting the conduction of current through said switch in both said first and second directions; or for preventing the conduction of current through said switch in either said first or second directions.

58. A programmable switch as defined in claim 57, wherein said cell portions comprise a pair of back-to-back diodes.

59. A programmable switch as defined in claim 58, wherein said cell portions are initially formed to prevent the conduction of current through said switch in either said first or second directions.

60. A method of programming a solid state semiconductor device having a plurality of semiconductor functions in series between a first and a second terminal, said semiconductor functions including a first subset which provides a relatively high impedance in a first direction along said series and a relatively low impedance in a second, opposite, direction along said series, and a second subset which provides a relatively high impedance in said second direction and a relatively low impedance in said first direction, said method comprising forming said device by depositing a plurality of layers of semiconductor material to provide said plurality of semiconductor functions, and selectively programming at least one semiconductor function of said first subset by applying a programming voltage across at least a portion of said device in said first direction.

61. A method of programming a solid state semiconductor device as described in claim 60, further comprising selectively programming at least one semiconductor function of said second subset by applying a programming voltage across at least a portion of said device in said second direction.

62. A method of programming a solid state semiconductor device as described in claim 60, wherein said applying of said programming voltage includes applying said voltage between said two terminals.

63. A method of programming a solid state semiconductor device as described in claim 60, wherein said device includes a third terminal, and said at least one semiconductor function of said first subset is between said first and third terminals and said at least one semiconductor function of said second subset is between said second and third terminals, and said applying of said programming voltage includes applying said programming voltage between said first and third terminals.

64. A method of programming a solid state semiconductor device as described in claim 60, wherein said semiconductor functions of said first and second subsets are provided by rectifying semiconductor junctions and said applying of said programming voltage includes applying a programming voltage of sufficient magnitude to cause a breakdown current across at least one said rectifying junction which provides said at least one semiconductor function of said first set.

65. A method of programming a solid state semiconductor device as described in claim 64, wherein said at least one rectifying junction includes phase changeable semiconductor material and said selectively programming said at least one semiconductor function of said first subset includes causing sufficient breakdown current to flow across said at least one rectifying junction so as to cause a phase change in the material of said junction.

66. An electrical circuit comprising:
a first conductor;
a second conductor; and
a programmable solid state semiconductor device connected between said first and second conductors, said device having a plurality of layers of semiconductor material to form a plurality of semiconductor junctions connected in electrical series between said conductors, said semiconductor junctions including a first subset which provides a relatively high impedance in a first direction along said series and a relatively low impedance in a second, opposite, direction along said series, and a second subset which provides a relatively high impedance in said second direction and a relatively low impedance in said first direction,
said circuit being originally formed with a relatively high impedance in both directions between said first and second conductors.

67. An electrical circuit as described in claim 66, wherein said programmable device includes two back-to-back diodes and wherein said first subset of semiconductor junctions include a rectifying semiconductor junction of a first of said back-to-back diodes and said second subset of semiconductor junctions includes a rectifying semiconductor junction of the other of said back-to-back diodes.

68. An electrical circuit as described in claim 67, wherein at least said first of said back-to-back diodes includes deposited, phase changeable semiconductor material.

69. An electrical circuit as described in claim 68, wherein said phase changeable material comprises an amorphous semiconductor alloy.

70. An electrical circuit as described in claim 69, wherein said alloy includes silicon.

71. An electrical circuit as described in claim 70, wherein said alloy includes hydrogen.

72. An electrical circuit as described in claim 70, wherein said alloy includes fluorine.

73. An electrical circuit as described in claim 69, wherein said alloy includes germanium.

74. An electrical circuit as described in claim 69, wherein said alloy includes both silicon and germanium.

75. An electrical circuit as described in claim 68 wherein said first diode includes a first layer of deposited semiconductor material of a first conductivity type, a second layer of deposited semiconductor material of a relatively intrinsic type which contacts said first layer, and a third layer of deposited semiconductor material of a second conductivity type which contacts said second layer.

76. An electrical circuit as described in claim 75, wherein the other of said back-to-back diodes includes a fourth layer of deposited semiconductor material of said first conductivity type, a fifth layer of deposited semiconductor material of a relatively intrinsic type which contacts said fourth layer, and a sixth layer of deposited semiconductor material of said second conductivity type which contacts said fifth layer.

77. An electrical circuit as described in claim 76, wherein the programmable device is formed on a substrate and the layers of deposited semiconductor material of said first diode are deposited over said substrate and the layers of deposited semiconductor material of said second diode are deposited over said layers of the first diode.

78. An electrical circuit as described in claim 77, wherein a layer of relatively conductive material is placed between said first and second diodes.

79. An electrical circuit as described in claim 78, wherein said relatively conductive material is a metal.

80. An electrical circuit as described in claim 78, further including conductive means connected to said relatively conductive material located between said first and second diodes for supplying a programming voltage and current to said relatively conductive material.

81. An electrical circuit as described in claim 68, wherein said first diode includes a portion of metal and said layer of semiconductor material forms a rectifying semiconductor junction with said portion of metal so as to provide said relatively high impedance in said first direction along said series and a relatively low impedance in said second, opposite, direction.

82. An electrical circuit as described in claim 81, wherein said other back-to-back diode includes an additional portion of metal and a layer of deposited semiconductor material which forms a rectifying semiconductor junction with said additional portion of metal so as to provide said relatively high impedance in said second direction and a relatively low impedance in said first direction.

83. An electrical circuit as described in claim 82, wherein the programmable device is formed on a substrate and the deposited semiconductor material of said first diode is deposited over said substrate and the deposited semiconductor material of said second diode is deposited over said semiconductor material of said first diode.

84. An electrical circuit as described in claim 83, wherein a layer of relatively conductive material is placed between said first and second diodes of said programmable device.

85. An electrical circuit as described in claim 84, wherein said layer of relatively conductive material is a metal which forms said rectifying junctions with the semiconductor material of both said first and second diodes.

86. An electrical circuit as described in claim 84, further including conductive means connected to said relatively conductive material located between said first and second diodes for supplying a programming voltage and current to said relatively conductive material.

* * * * *